United States Patent
Dao et al.

(10) Patent No.: US 12,373,731 B2
(45) Date of Patent: Jul. 29, 2025

(54) ELASTIC STRAIN ENGINEERING OF MATERIALS

(71) Applicants: Massachusetts Institute of Technology, Cambridge, MA (US); Skolkovo Institute of Science and Technology, Moscow (RU); Nanyang Technological University, Singapore (SG)

(72) Inventors: Ming Dao, West Roxbury, MA (US); Ju Li, Weston, MA (US); Zhe Shi, Cambridge, MA (US); Evgenii Tsymbalov, Moscow (RU); Alexander Shapeev, Moscow (RU); Subra Suresh, Singapore (SG)

(73) Assignees: Massachusetts Institute of Technology, Cambridge, MA (US); Skolkovo Institute of Science and Technology, Moscow (RU); Nanyang Technological University, Singapore (SG)

( * ) Notice: Subject to any disclaimer, the term of this patent is extended or adjusted under 35 U.S.C. 154(b) by 1038 days.

(21) Appl. No.: 17/283,949

(22) PCT Filed: Oct. 12, 2018

(86) PCT No.: PCT/RU2018/000679
§ 371 (c)(1),
(2) Date: Apr. 8, 2021

(87) PCT Pub. No.: WO2020/076181
PCT Pub. Date: Apr. 16, 2020

(65) Prior Publication Data
US 2021/0398018 A1    Dec. 23, 2021

(51) Int. Cl.
*G06F 30/20* (2020.01)
*G06N 20/00* (2019.01)

(52) U.S. Cl.
CPC ............. *G06N 20/00* (2019.01); *G06F 30/20* (2020.01)

(58) Field of Classification Search
CPC ........ G06N 20/00; G05B 17/02; G06F 30/20; G06F 30/25; G06F 30/27; G06F 30/28; G06F 2111/00; G06F 2119/22
See application file for complete search history.

(56) References Cited

U.S. PATENT DOCUMENTS 8,321,185 B2 * 11/2012 Maeda ..................... G06F 30/23
703/2
2002/0157478 A1 * 10/2002 Seale ........................ G01N 3/00
73/789

(Continued)

FOREIGN PATENT DOCUMENTS

CN    106055784 A   * 10/2016  ........... G06F 30/367
CN    107677647 A   *  2/2018  ............. G01N 21/63

(Continued)

OTHER PUBLICATIONS

Saha, S.K. ("Different Approaches to Improve Metamorphic Buffer Layers Grown on a GaAs Substrate" Bangladesh University of Engineering and Technology, 2009).*
Marley, E.A. ("The Development of InP-Based Optoelectronic Devices", Massachusetts Institute of Technology, Jun. 1996).*
Narendar et al. ("Investigation of the effect of nonlocal scale on ultrasonic wave dispersion characteristics of a monolayer graphene", Computational Materials Science, 2010).*

(Continued)

*Primary Examiner* — Kibrom K Gebresilassie
(74) *Attorney, Agent, or Firm* — Wolf, Greenfield & Sacks, P.C.

(57) ABSTRACT

Methods for training statistical models for the bandgap and energy dispersion of materials as a function of an applied strain, as well as uses of these trained statistical models for elastic strain engineering of materials, are described.

18 Claims, 15 Drawing Sheets

(56) References Cited

U.S. PATENT DOCUMENTS

| | | | |
|---|---|---|---|
| 2011/0313748 A1* | 12/2011 | Li | G06F 30/30 703/14 |
| 2013/0238532 A1 | 9/2013 | Kearns et al. | |
| 2014/0017839 A1 | 1/2014 | Li et al. | |
| 2017/0046629 A1* | 2/2017 | Reinecke | G06F 21/566 |
| 2019/0178788 A1* | 6/2019 | Nguyen | G01B 11/0641 |
| 2025/0056922 A1* | 2/2025 | Kitano | H05B 33/12 |

FOREIGN PATENT DOCUMENTS

| | | | |
|---|---|---|---|
| CN | 108345716 A * | 7/2018 | G06F 30/13 |
| EP | 2637010 A1 | 9/2013 | |
| EP | 2648138 A1 | 10/2013 | |
| JP | 2008-142774 A | 6/2008 | |
| JP | 2013-190427 A | 9/2013 | |
| WO | WO 03/071451 A1 | 8/2003 | |
| WO | WO 2017127887 A1 * | 8/2017 | G06T 19/20 |

OTHER PUBLICATIONS

Streetman et al., Solid state electronic devices. $6^{th}$ Ed. PHI Learning. New Delhi. 2009. 2-3, 67-68, 202, 219, 402, 406-7, 411. 13 pages.

International Search Report and Written Opinion mailed Aug. 6, 2019, for Application No. PCT/RU2018/000679.

Shi et al., Deep elastic strain engineering of bandgap through machine learning. Proc Natl Acad Sci U S A. Mar. 5, 2019;116(10):4117-4122. doi: 10.1073/pnas.1818555116. Epub Feb. 15, 2019. Erratum in: Proc Natl Acad Sci U S A. Mar. 17, 2020;117(11):6274.

Kumar et al., Mechanical strain dependent electronic and dielectric properties of two-dimensional honeycomb structures of $MoX_2$ (X=S, Se, Te). Phys B: Cond Matter. Jun. 2013; 419: 66-75.

Ramprasad et al., Machine learning in materials informatics: recent applications and prospects. NPJ Comp Mater. 2017; 3:54.

Roldan et al., Strain engineering in semiconducting two-dimensional crystals. J Phys. Condens. Matter. 2015; 27: 313201.

PCT/US2018/000679, Aug. 6, 2019, International Search Report and Written Opinion.

* cited by examiner

ELASTIC STRAIN ENGINEERING OF MATERIALS

RELATED APPLICATIONS

This application is a national stage filing under 35 U.S.C. § 371 of International Patent Application No. PCT/RU2018/000679, filed Oct. 12, 2018, the disclosure of which is incorporated herein by reference in its entirety.

FIELD

Disclosed embodiments are related to elastic strain engineering of materials.

BACKGROUND

Nanostructured materials can withstand much higher tensile and/or shear elastic strains without mechanical relaxation or failure than their conventional counterparts. This range of possible strains open up a huge parameter space for engineering of material properties through the application of elastic strain. For example, strain can be used to tune various material properties analogous to the manipulation of the material's chemistry. For example, the electronic bandgap of a material may open or close with a particular strain, thus, altering the electrical, thermal, optical and/or magnetic characteristics of the material. However, due to the complexities associated with predicting and/or testing the entire range of possible strains, and the resulting material properties, current strain engineering of materials has been limited to uniaxial and biaxial strains as have been applied in strained silicon.

SUMMARY

In one embodiment, a method includes: obtaining a range of strain coordinates having at least three degrees of freedom; obtaining training data, wherein the training data includes bandgap and energy dispersion data for a material within the range of strain coordinates; generating a first trained statistical model using the training data and the range of strain coordinates, wherein the first model is at least one selected from the group of a bandgap model and a dispersion energy model of the material; and storing the first model for subsequent use.

In another embodiment, at least one non-transitory computer-readable storage medium may store processor executable instructions that, when executed by at least one processor, cause the at least one processor to perform a method including: obtaining a range of strain coordinates having at least three degrees of freedom; obtaining training data, wherein the training data includes bandgap and energy dispersion data for a material within the range of strain coordinates; generating a first trained statistical model using the training data and the range of strain coordinates, wherein the first model is at least one selected from the group of a bandgap model and a dispersion energy model of the material; and storing the first model for subsequent use in determining one or more properties of the material.

In yet another embodiment, a method includes: obtaining a desired bandgap; providing the desired bandgap to a trained statistical bandgap model of a material and obtaining corresponding output; and identifying based on the output a strain with a lowest strain energy density associated with the desired bandgap, wherein the strain has at least three degrees of freedom.

In other embodiments, at least one non-transitory computer-readable storage medium may store processor executable instructions that, when executed by at least one processor, cause the at least one processor to perform a method including: obtaining a desired bandgap; providing the desired bandgap to a trained statistical bandgap model of a material and obtaining corresponding output; and identifying based on the output a strain with a lowest strain energy density associated with the desired bandgap, wherein the strain has at least three degrees of freedom.

In still another embodiment, a method of determining a property of a component includes: obtaining a strain state of the component, wherein the strain state has at least three degrees of freedom; and providing the strain state of the component to a trained statistical bandgap model of a material of the component and obtaining a corresponding output bandgap of the component.

In another embodiment, at least one non-transitory computer-readable storage medium may store processor executable instructions that, when executed by at least one processor, cause the at least one processor to perform a method including: obtaining a strain state of the component, wherein the strain state has at least three degrees of freedom; and providing the strain state of the component to a trained statistical bandgap model of a material of the component and obtaining a corresponding output bandgap of the component.

In some embodiments, an electrical circuit includes an electrical component formed from silicon with a strain tensor applied to the silicon, where the strain tensor is:

$$\begin{pmatrix} \varepsilon_{11} & 0 & 0 \\ 0 & \varepsilon_{22} & 0 \\ 0 & 0 & \varepsilon_{33} \end{pmatrix},$$

and

In the above strain tensor, $\varepsilon_{11}$, $\varepsilon_{22}$, and $\varepsilon_{33}$ are between or equal to 8.9% and 9.5%.

In another embodiment, an electrical circuit includes an electrical component formed from silicon with a strain tensor applied to the silicon, where the strain tensor is:

$$\begin{pmatrix} \varepsilon_{11} & \varepsilon_{12} & \varepsilon_{13} \\ \varepsilon_{21} & \varepsilon_{22} & \varepsilon_{23} \\ \varepsilon_{31} & \varepsilon_{32} & \varepsilon_{33} \end{pmatrix},$$

and

In the above strain tensor, $\varepsilon_{11}$ is between or equal to 0.25% and 0.75%, $\varepsilon_{12}$ is between or equal to 1.45% and 1.95%, $\varepsilon_{13}$ is between or equal to 0.5% and 1.0%, $\varepsilon_{21}$ is between or equal to 1.45% and 1.95%, $\varepsilon_{22}$ is between or equal to $-1.0\%$ and $-1.5\%$, $\varepsilon_{23}$ is between or equal to $-1.65\%$ and $-2.15\%$, $\varepsilon_{31}$ is between or equal to 0.5% and 1.0%, $\varepsilon_{32}$ is between or equal to $-1.65\%$ and $-2.15\%$, and $\varepsilon_{33}$ is between or equal to $-0.8\%$ and $-1.35\%$.

It should be appreciated that the foregoing concepts, and additional concepts discussed below, may be arranged in any suitable combination, as the present disclosure is not limited in this respect. Further, other advantages and novel features of the present disclosure will become apparent from the following detailed description of various non-limiting embodiments when considered in conjunction with the accompanying figures.

BRIEF DESCRIPTION OF DRAWINGS

The accompanying drawings are not intended to be drawn to scale. In the drawings, each identical or nearly identical component that is illustrated in various figures may be represented by a like numeral. For purposes of clarity, not every component may be labeled in every drawing. In the drawings.

DETAILED DESCRIPTION

Figure 1A:
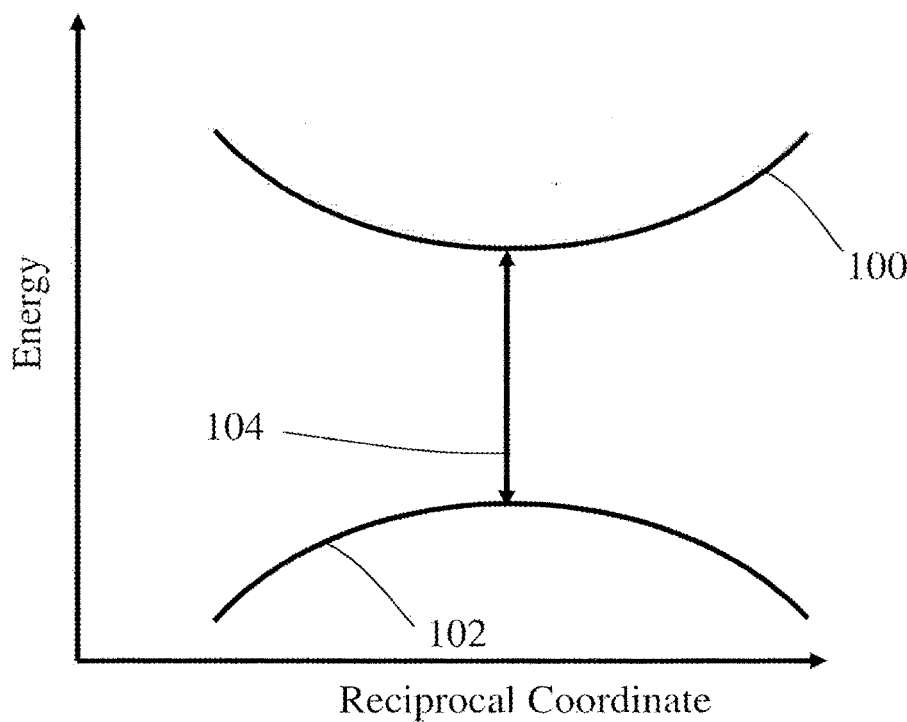
FIG. 1A is a schematic diagram showing the bandgap in an unstrained material.

The Inventors have recognized that predicting and/or testing the material properties of a strain engineered material with strains having three or more degrees of freedom is extremely difficult due to the much larger at least three-dimensional hyperspace that may be investigated. Accordingly, it is impractical to experimentally explore this entire range of possible strains that may be applied to a material to alter the properties of that material. Also, due to the computational complexity involved in determining the bandgap and energy dispersion of a material at a particular strain, it is also impractical to calculate all of the possible combinations of strain and bandgap and/or energy dispersion of a material.

In view of the above, the Inventors have recognized the benefits associated with developing a trained statistical model for determining the relationship between the bandgap and/or the energy dispersion of a material versus strain having three or more, and in some instances at least six degrees of freedom. This may include the application of three-dimensional and/or six-dimensional strain tensors to a material. Specifically, conventional methods of calculating the bandgap and/or energy dispersion of a material may be conducted to obtain a desired number of training data points. Alternatively, in some embodiments, the training data may be obtained from data available from prior experiments and/or calculations. This training data may be input into a statistical model along with a desired range of strain coordinates to generate a trained statistical model. Again these strain coordinates may include strains with at least three or more degrees of freedom, and in some embodiments six degrees of freedom. Depending on the particular embodiment, the trained statistical model may be either a bandgap model or an energy dispersion model. In instances in which the trained statistical model is an energy dispersion model, the training data and the desired range of strain coordinates as well as a corresponding range of reciprocal space coordinates may be provided to the statistical model which may output the desired trained statistical model.

The above detailed concept of developing a statistical model for predicting the bandgap and/or energy dispersion of a material for strains is very general in nature. For example, the process may be used for any number of different types of crystals and materials as well as across any number of different desired ranges of strains with any number of desired degrees of freedom for the applied strains including, for example, three-dimensional strains, six-dimensional strains, and/or any other appropriate strain with any appropriate degrees of freedom.

Once a trained statistical model has been generated, the trained statistical model may be stored for subsequent use. For example, the trained statistical model may be stored on at least one non-transitory computer readable storage medium. The stored model may then be used for a number of different applications related to determining the properties of a material under a strain as detailed further below. These uses may include, but are not limited to, determining possible strain states of a material for a desired bandgap, visualization of band structures of a material with a particular strain state, identification of direct to indirect bandgap transitions, identification of semiconductor to metal bandgap transition, the lowest energy density strain state to provide a desired bandgap, use with finite element analysis modules to determine the bandgap of a strained material, and/or any other appropriate use as described herein.

It should be understood that the strains disclosed herein for either the training and/or use of a trained statistical model may correspond to any desired range of strains, and may be assumed to refer to elastic strains unless otherwise indicated. For example, in some embodiments, a range of strain coordinates associated with a trained statistical model may correspond to the physical elastic strain limits of a material being modeled. Alternatively, the range of strain coordinates may be a subset of this physically possible range as selected and determined by a user, a preset range of strain coordinates, and/or any other appropriate method for determining a range of strain coordinates for modeling purposes. That said, in one embodiment, each of the components of a strain tensor may be independently selected to be an elastic strain that is greater than −20%, −15%, −10%, −5%, 0%, and/or any other appropriate strain. Correspondingly, each component of the strain tensor may be independently selected to be less than 20%, 15%, 10%, 5%, and/or any other appropriate strain. Combinations of the forgoing are contemplated including, for example, each of the individual strain components may be between or equal to −20% and 20%, −10% and 10%, and/or any other appropriate range of strains. In addition to the individual applied strain components, an overall magnitude of an applied strain may be between or equal to 1% and 20%, 1% and 10%, 5% and 20%, 5% and 10%, and/or any other appropriate range of strains as the disclosure is not so limited.

For the purposes of the various embodiments and examples described herein, a strain, strain coordinate, strain tensor, or other similar term may refer to a strain that has been applied to a material with three or more degrees of freedom including, for example three degrees of freedom (i.e. three-dimensional strain space), six degrees of freedom (i.e. six-dimensional strain space), and/or any other appropriate strain, strain tensor, or strain coordinate applied with any desired number of degrees of freedom. Additionally, these strains may also refer to elastic strains. For example, a shearless elastic strain may be applied using a three-dimensional strain tensor with three degrees of freedom while in another embodiment due to the strain tensor being a symetric matrix non-redundant strains may be defined using six degrees of freedom resulting in what may be described as a six dimensional strain tensor. Accordingly, it should be understood that strains may be described relative to the disclosed embodiments using any appropriate strain with any appropriate number of degrees of freedom ranging from three degrees of freedom strain (three-dimensional strain) to six degrees of freedom strain (six-dimensional strain) as the disclosure is not limited in this fashion.

Using the models described herein, particular strain states of silicon associated with various material property transitions were identified as discussed further in the examples. For example, in one embodiment, the least strain energy density to transition silicon from an indirect to a direct bandgap material may occur for a triaxial tensile strain applied to a silicon material defined by the strain tensor:

$$\begin{pmatrix} \varepsilon_{11} & 0 & 0 \\ 0 & \varepsilon_{22} & 0 \\ 0 & 0 & \varepsilon_{33} \end{pmatrix}$$

where $\varepsilon_{11}$, $\varepsilon_{22}$, and $\varepsilon_{33}$ are between or equal to 8.9% and 9.5%, and in some instances these strain components may preferably be approximately 9.2%. Further in some embodiments the strain components may be approximately equal to each other.

In another embodiment, the least energy required to realize a semiconductor/insulator to metal transition in silicon is by applying an elastic strain tensor of $$\begin{pmatrix} \varepsilon_{11} & \varepsilon_{12} & \varepsilon_{13} \\ \varepsilon_{21} & \varepsilon_{22} & \varepsilon_{23} \\ \varepsilon_{31} & \varepsilon_{32} & \varepsilon_{33} \end{pmatrix}$$

where $\varepsilon_{11}$ is between or equal to 0.25% and 0.75%, $\varepsilon_{12}$ is between or equal to 1.45% and 1.95%, 813 is between or equal to 0.5% and 1.0%, $\varepsilon_{21}$ is between or equal to 1.45% and 1.95%, $\varepsilon_{22}$ is between or equal to −1.0% and −1.5%, $\varepsilon_{23}$ is between or equal to −1.65% and −2.15%, $\varepsilon_{31}$ is between or equal to 0.5% and 1.0%, $\varepsilon_{32}$ is between or equal to −1.65% and −2.15%, and $\varepsilon_{33}$ is between or equal to −0.8% and −1.35%. In some embodiments, these strain components may more preferably correspond to $\varepsilon_{11}$ being approximately 0.55%, $\varepsilon_{12}$ being approximately 1.69%, $\varepsilon_{13}$ being approximately 0.74%, 821 being approximately 1.69%, 822 being approximately −1.26%, 23 being approximately −1.92%, $\varepsilon_{31}$ being approximately 0.74%, $\varepsilon_{32}$ being approximately −1.92%, and $\varepsilon_{33}$ is approximately −1.04%.

Due to the desirable properties afforded by the material property transitions noted above for the strain engineered silicon, it should be understood that strained silicon with the above noted strain states may be included in an electrical circuit. For example, an electrical component of an electrical circuit may be formed from silicon with a strain tensor as described above. This electrical component may be electrically connected to any other appropriate portion of the electrical circuit to form a functional part of the circuit including, but not limited to, electrical contact pads, junctions, electrical traces, and/or any other appropriate electrical component of a circuit as the disclosure is not so limited.

In some embodiments, the components made from an elastically strained material may have a characteristic length scale to enhance elastic strain limit of the material. For example, certain nanoscale materials may exhibit enhanced elastic strain limits as compared to larger bulk materials. Accordingly, a component made from a material that has been elastically strained to modify one or more material properties as described herein may have a characteristic length scale, such as a thickness, or other appropriate dimension, that is less than about 1 μm, 500 nm, 100 nm, and/or any other appropriate length scale. Appropriate types of materials that may be elastically strained to modify their material properties may include, but are not limited to, silicon, diamond, gallium arsenide (GaAS), germanium (Ge), gallium nitride (GaN), two-dimesional/atomically thin materials, and/or any other appropriate material. Of course, it should be understood that components with characteristic length scales that are both larger and smaller than those noted above, as well as components that are made using different materials are also contemplated as the disclosure is not limited in this fashion.

For the purposes of this disclosure, the energy dispersion, which may also be referred to as the band structure, of a material may describe the range of energies that an electron within a material may have (i.e. energy bands, allowed energy states, bands, or other similar terms) and ranges of energy that the electrons do not occupy (i.e. bandgaps). These energy bands may be analyzed to identify various properties of a material as detailed further herein.

Turning to the figures, specific non-limiting embodiments are described in further detail. It should be understood that the various systems, components, features, and methods described relative to these embodiments may be used either individually and/or in any desired combination as the disclosure is not limited to only the specific embodiments described herein.

Figure 1B:
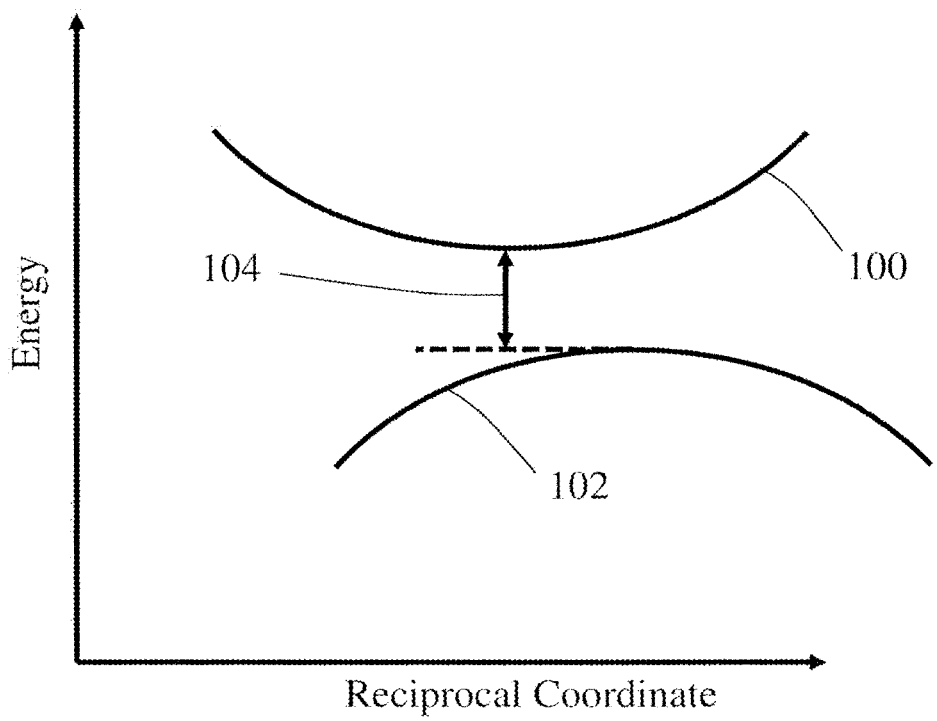
FIG. 1B is a schematic diagram showing the bandgap of FIG. 1A after a strain is applied to the material.

FIGS. 1A and 1B illustrate several types of changes that may occur to a band structure of a material when an elastic strain is applied to the material. Specifically, FIG. 1A depicts a graph including a conduction band 100, a valence band 102, and a bandgap 104. In the illustrated embodiment, the material has a direct bandgap between the conduction band and the valence band. FIG. 1B illustrates a possible band structure for the same material after an elastic strain has been applied to the material. In the illustrated embodiment, the bandgap between the conduction and valence bands has decreased. Additionally, the relative positioning of the conduction band minimum and the valence band maximum has shifted so that the material is now an indirect bandgap material. Accordingly, the applied elastic strain has been used to change the properties of the material. However, as previously discussed, it is difficult to determine the specifics about how these properties will change with elastic strain for more than a few isolated strain coordinates due to the complex computations involved with solving such a problem when the strains are applied in at least three-dimensional strain space including when strain tensors and/or coordinates having at least three, six, or other appropriate number of degrees of freedom are applied.

Figure 2:
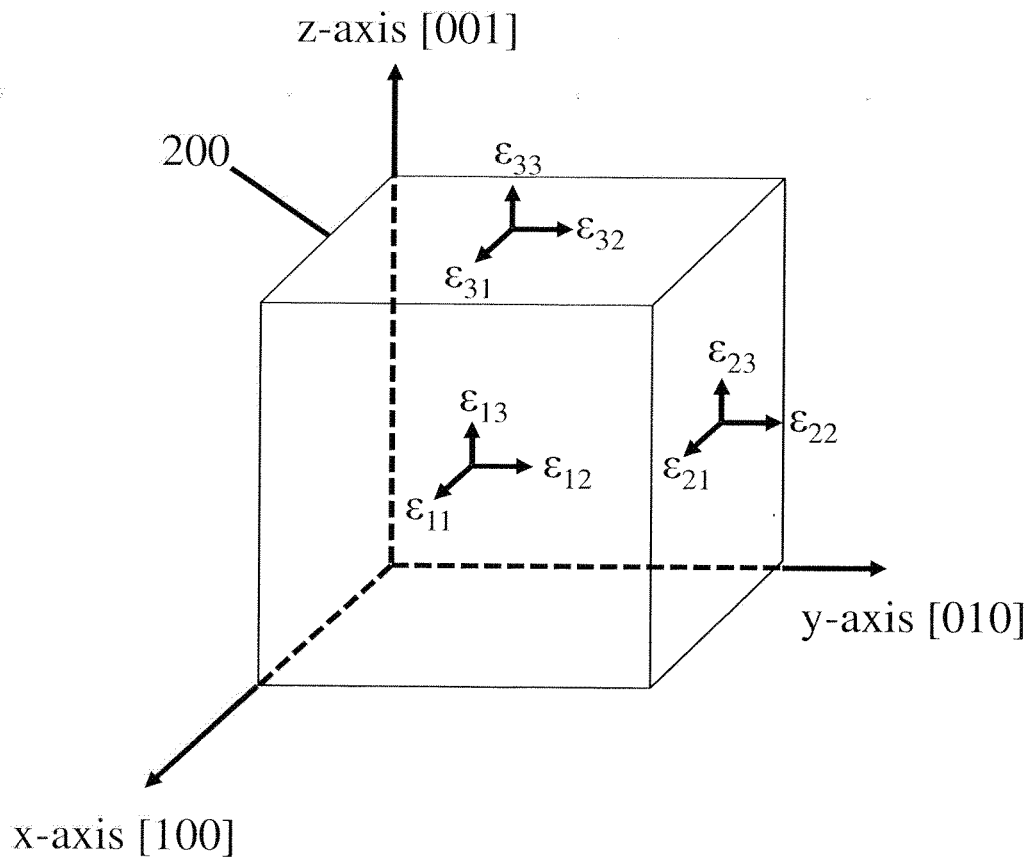
FIG. 2 is a schematic diagram of strains that can be applied to a material.
Figure 3:
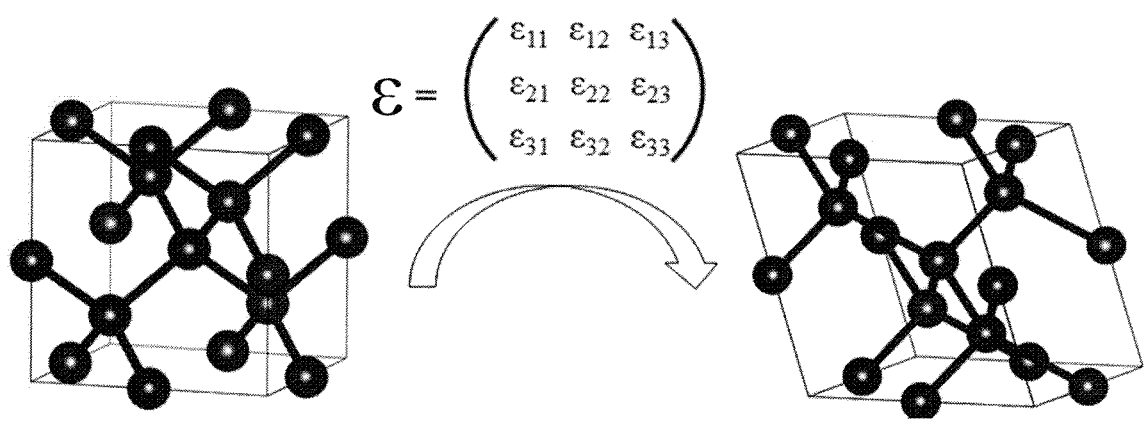
FIG. 3 is a schematic diagram of a strain being applied to deform a unit cell.

FIG. 2 illustrates a cubic unit cell 200. The unit cell has diamond cubic crystallographic directions [100], [010], and [001] corresponding to the x, y, and z axes, respectively. A strain tensor may correspond to the various normal and shear strain components that may be applied to the unit cell. Typically, an elastic strain tensor may be indicated by:

$$\varepsilon = \begin{pmatrix} \varepsilon_{11} & \varepsilon_{12} & \varepsilon_{13} \\ \varepsilon_{21} & \varepsilon_{22} & \varepsilon_{23} \\ \varepsilon_{31} & \varepsilon_{32} & \varepsilon_{33} \end{pmatrix}$$

where $\varepsilon_{11}$, $\varepsilon_{22}$, $\varepsilon_{33}$ correspond to the strain components that are applied normal to the unit cell in the [100], [010], and [001] crystallographic directions respectfully. The remaining strain components, as indicated in the figure, are applied in directions parallel to the various surfaces of the unit cell and correspond to shear strains applied parallel to the surfaces of the unit cell. For the purposes of the current disclosure, the various strain tensors described herein may correspond to the above noted nomenclature. FIG. 3 illustrates a strain tensor being applied to elastically deform a unit cell of a crystal structure from an undeformed to a deformed configuration. For example, a strain tensor of:

$$\varepsilon = \begin{pmatrix} 10\% & 0 & 0 \\ 0 & 10\% & 0 \\ 0 & 0 & 10\% \end{pmatrix}$$

refers to a strain coordinate corresponding to a 10% triaxial tension of the material, and:

$$\varepsilon = \begin{pmatrix} 0 & 10\% & 0 \\ 10\% & 0 & 0 \\ 0 & 0 & 0 \end{pmatrix}$$

is a strain coordinate corresponding to a 10% pure shear strain being applied to the material.

Figure 4A:
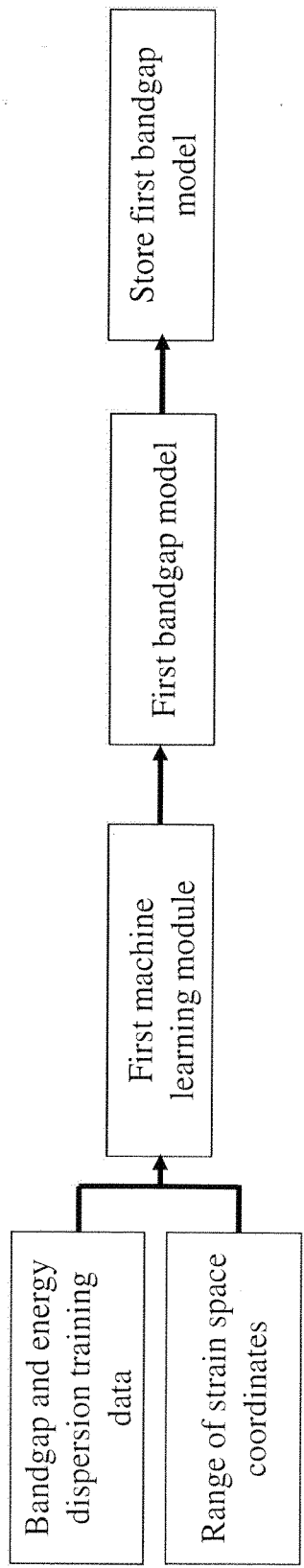
FIG. 4A is one embodiment of a fitting process to determine a trained statistical bandgap model.
Figure 4B:
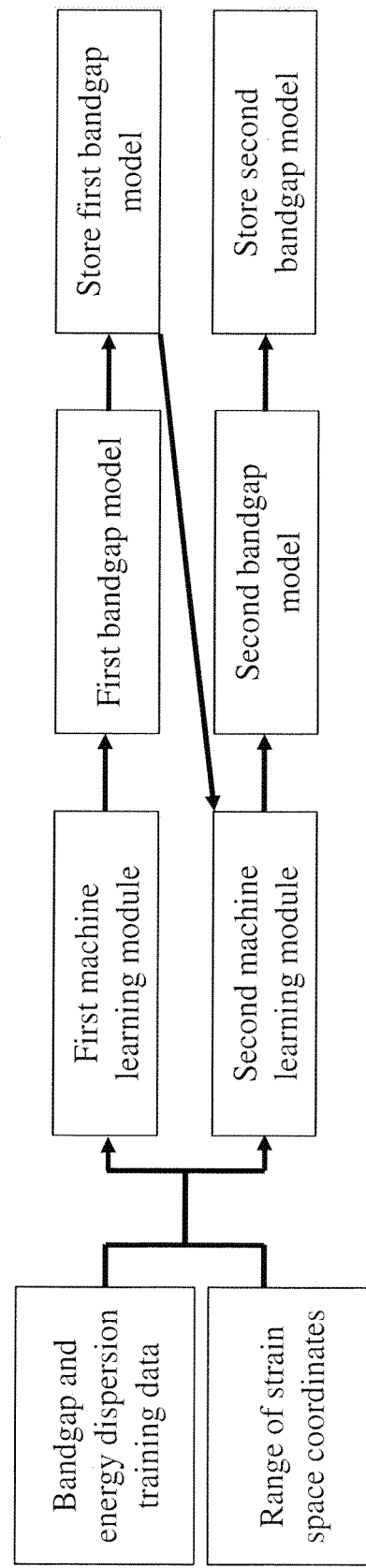
FIG. 4B is another embodiment of a fitting process to determine a trained statistical bandgap model.
Figure 5:
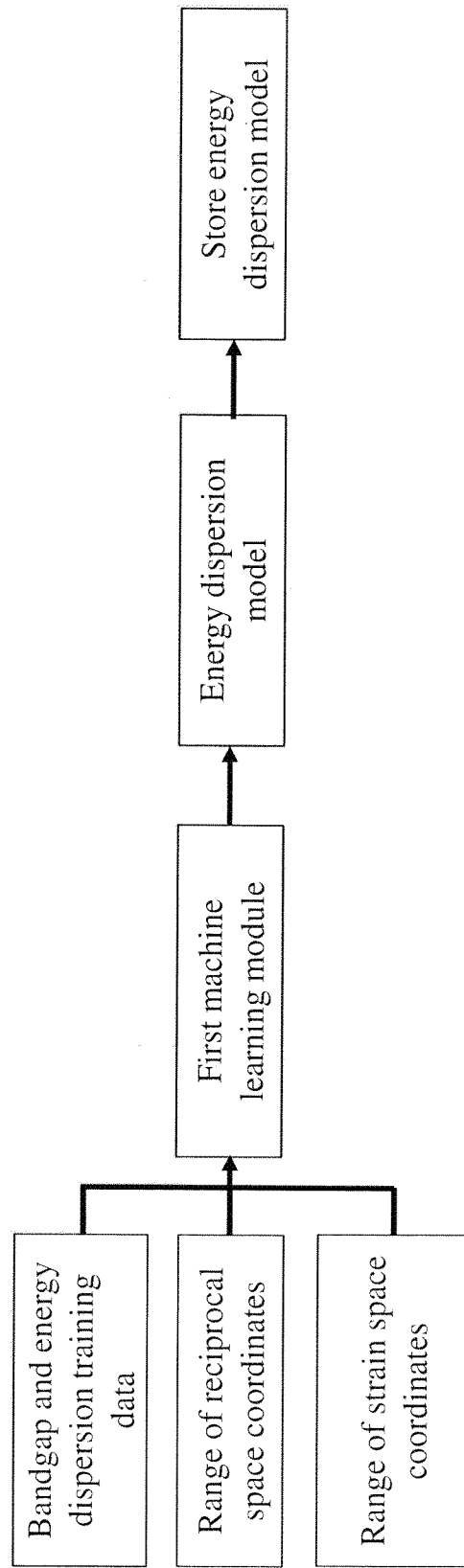
FIG. 5 is one embodiment of a fitting process to determine a trained statistical energy dispersion model.

FIGS. 4A-5 depict embodiments related to methods for training statistical models of the bandgap and/or energy dispersion of a material relative to a desired range of strains.

In the embodiment illustrated in FIG. 4A, a range of strain coordinates may be input to a first machine learning module. The range of strain coordinates may correspond to the physically possible range of elastic strains that may be applied to a material. Alternatively, a user may input a desired range of elastic strains over which a model of a bandgap of the material is desired. For example, a user may provide a desired elastic strain magnitude, absolute strain tensor component limits, and/or any other desirable combination thereof as the disclosure is not limited in this fashion. In such an embodiment, the range of strain coordinates may be provided by the user using any appropriate input device as described further below. However, embodiments in which the range of strain coordinates are predetermined for use in training a statistical model are also contemplated.

In addition to the range of strain coordinates, training data may also be provided to the first machine learning module. Specifically, bandgap and energy dispersion training data distributed throughout the range of desired strain coordinates may be obtained and provided to the first machine learning module. This training data may be obtained in any appropriate fashion using prior experiments and/or calculations. However, in some embodiments, obtaining the training data may correspond to ab-initio calculations to obtain the bandgap and energy dispersion training data prior to providing the training data to the first machine learning module. Due to the computationally expensive process of calculating this training data, the training data may be limited to a predetermined number of data points. For example, the training data may be limited to between or equal to 500 data points and 1000 data points, 500 data points and 2000 data points, and/or any other appropriate number of data points. Regardless of the specific number, these training data points may be randomly selected throughout the range of strain coordinates, evenly distributed throughout the range of strain coordinates, and/or any other appropriate disposition as the disclosure is not limited in this fashion. Regardless of how the training data points are distributed, in some embodiments, the training data may be calculated using first-principles computations, including standard density functional theory with GW (invoking Green's function and screened Coulomb interaction) corrections or with hybrid Heyd-Scuseria-Ernzerhof functionals, and/or with any other appropriate methodology as the disclosure is not limited to how the bandgap and energy dispersion training data versus a desired strain space is obtained.

As also shown in FIG. 4A, the bandgap and energy dispersion training data as well as the range of strain coordinates are input into a statistical model in the first machine learning module. Once these inputs have been received, the first machine learning module may generate a trained statistical model using the training data and the range of strain coordinates. The resulting output from the first machine learning module corresponds to the illustrated first bandgap model, which is a trained statistical model of the bandgap of a material as a function of the strain applied to the material. The first bandgap model may also be stored in an appropriate non-transitory computer readable medium for subsequent use as detailed further below.

In some embodiments, when generating an initial trained statistical model as detailed above, a machine learning module may implement a fitting approximation that is relatively less computationally expensive to permit the trained statistical model to be generated in a reasonable time period. However, this may result in a trained statistical model that is less accurate than may be desired for certain applications. In such an instance, it may be desirable to generate a second trained statistical model that further refines the already trained statistical model using a second type of fitting approximation to generate a more accurate second trained statistical model. This process is sometimes referred to as delta machine learning and/or data fusion where a previously trained model is used as an input to a more accurate and computationally complex model to provide a more accurate model at a lower computational cost. Such an embodiment is depicted in FIG. 4B where a first trained statistical model corresponding to a first bandgap model is generated and stored as detailed above relative to FIG. 4A. This first bandgap model may then be input along with the previously obtained training data and range of strain coordinates into a second machine learning module. The second machine learning module may then fit the training data using the first bandgap model as a starting point and a more accurate, and correspondingly more computationally expensive or complex, fitting approximation. After the fitting process, the second machine learning module may output a second trained statistical model corresponding to the illustrated second bandgap model. As above, the second bandgap model may be stored for subsequent usage.

FIG. 5 depicts an embodiment similar to those described relative to FIGS. 4A-4B. However, in this particular embodiment, the generation of an energy dispersion model which may be used to model the energy bands and/or predict various properties of a material is depicted. Similar to the above embodiments, bandgap and energy dispersion training data may be obtained within a desired range of strain space coordinates. Correspondingly, a range of reciprocal space coordinates associated with the training data and/or range of strain space coordinates may also be obtained. A range of reciprocal space coordinates as described herein may in some embodiments correspond to a Fourier transform of the corresponding strain coordinates. The training data as well as the range of reciprocal space coordinates and the range of strain space coordinates may be input into a first machine learning module which may fit the energy dispersion of the material versus strain. The resulting output is the generation of a trained strained statistical model corresponding to the depicted energy dispersion model which may be stored for subsequent usage on an appropriate non-transitory computer readable medium. While the usage of only a single machine learning module is depicted in the figure, it should be understood that embodiments in which an iterative machine learning process is implemented are also contemplated. For example, in some embodiments, the generated energy dispersion model may be provided as an input to a second machine learning module using a more complex fitting approximation to generate a second more refined energy dispersion model similar to that described above relative to the second bandgap model.

It should be understood that the trained statistical models disclosed herein may be generated using any appropriate statistical model. For example, the machine learning modules depicted in FIGS. 4A-5, may correspond to any appropriate fitting method capable of generating the desired trained statistical models including, but are not limited to, artificial neural networks (ANN), gradient boosting regression (GBR), random forest regression (RFR), other kernel-based fitting methods, Lagrange polynomial fitting, and/or any other appropriate type of fitting method.

It should also be understood that the above noted fitting methods may be combined with any appropriate type of fitting approximation to provide a desired combination of model accuracy versus computational expense. For example, appropriate approximation methods that may be used include, but are not limited to, GW theory, HSE06, generalized gradient approximation, local density approximation, meta-GGA, combinations of the forgoing, and/or any other appropriate type of approximation as the disclosure is not limited in this fashion. Additionally, as noted previously, in instances where an iterative training process is used (i.e. data fusion), as shown in FIG. 4B, the first statistical training model may use a first fitting approximation with a lower computational cost and the second statistical training model may use a second fitting approximation that is more accurate, but more computationally costly, then the first fitting approximation. In one such embodiment, an artificial neural network may use a first fitting approximation such as PBE to generate the first trained statistical model and a fitting approximation such as GW may be used with the artificial neural network to generate the second trained statistical model while using the first trained statistical model as an input. Of course, it should be understood that any appropriate combination of fitting approximations with the disclosed statistical models may be used as the disclosure is not limited to only the specifically disclosed combination.

Figure 6B:
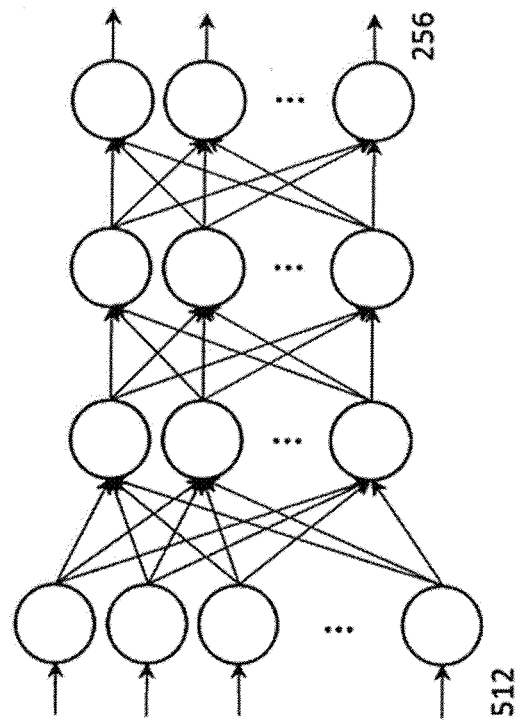
FIG. 6B is one embodiment of a neural network for band structure (i.e. energy dispersion) fitting.
Figure 6A:
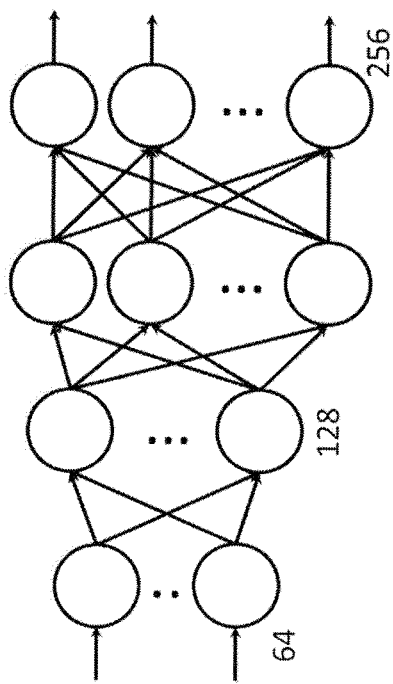
FIG. 6A is one embodiment of a neural network for bandgap fitting.

FIGS. 6A and 6B illustrate the structure of two possible embodiments of neural networks that may be used to generate the trained statistical models disclosed herein. FIG. 6A shows a deep neural network, including four hidden layers. The layers have a (64-128-256-256) structure. FIG. 6B illustrates a similar deep neural network including four hidden layers with a (512-256-256-256) structure. Without wishing to be bound by theory, the first neural network shown in FIG. 6A may be more suited to developing models for more limited ranges of strain, such as determining a bandgap model for non-shear strains in using strains with three degrees of freedom, i.e. a three-dimensional strain tensor. In contrast, the more complex artificial novel network shown in FIG. 6B may be appropriate for use with more complex problems such as the modeling of the bandgap of a material including shear strains, as well as the complicated task of developing an energy dispersion model for predicting the bands energy of a material strained in using a strain tensor with three or more degrees of freedom. Depending on the particular embodiment, the deep neural networks depicted in the figures may be a feed-forward-structured artificial neural network including a leaky rectified linear unit as the activation function. The depicted artificial networks may also incorporate the Adam stochastic optimization method, the orthogonal weight initialization, and dropout technique to prevent overfitting. Of course, it should be understood that any appropriate structure for an artificial neural network may be used including artificial neural networks with any appropriate number of hidden layers and/or individual neurons per layer that are both greater than and less than those noted above as the current disclosure is not limited to only using the depicted artificial neural networks.

Figure 7:
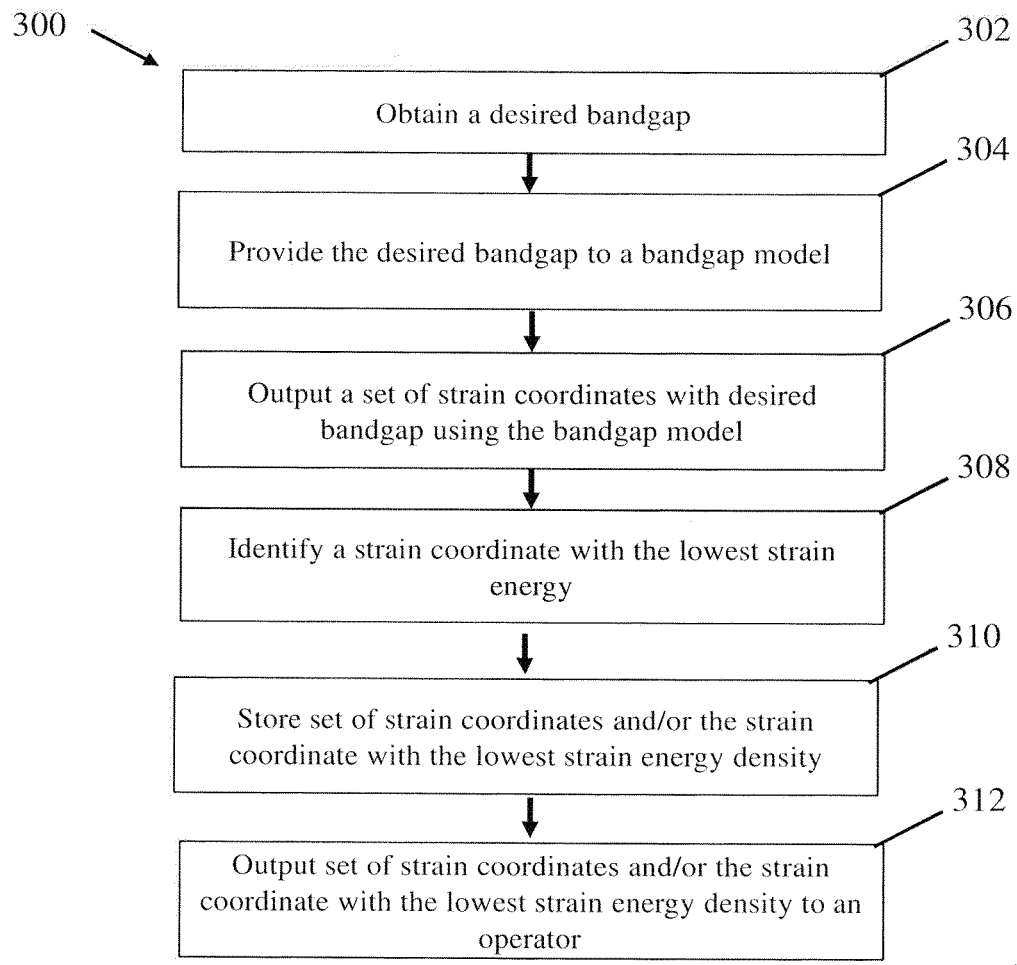
FIG. 7 is a flow diagram of one embodiment for determining a set of strain coordinates associated with a desired bandgap.
Figure 8:
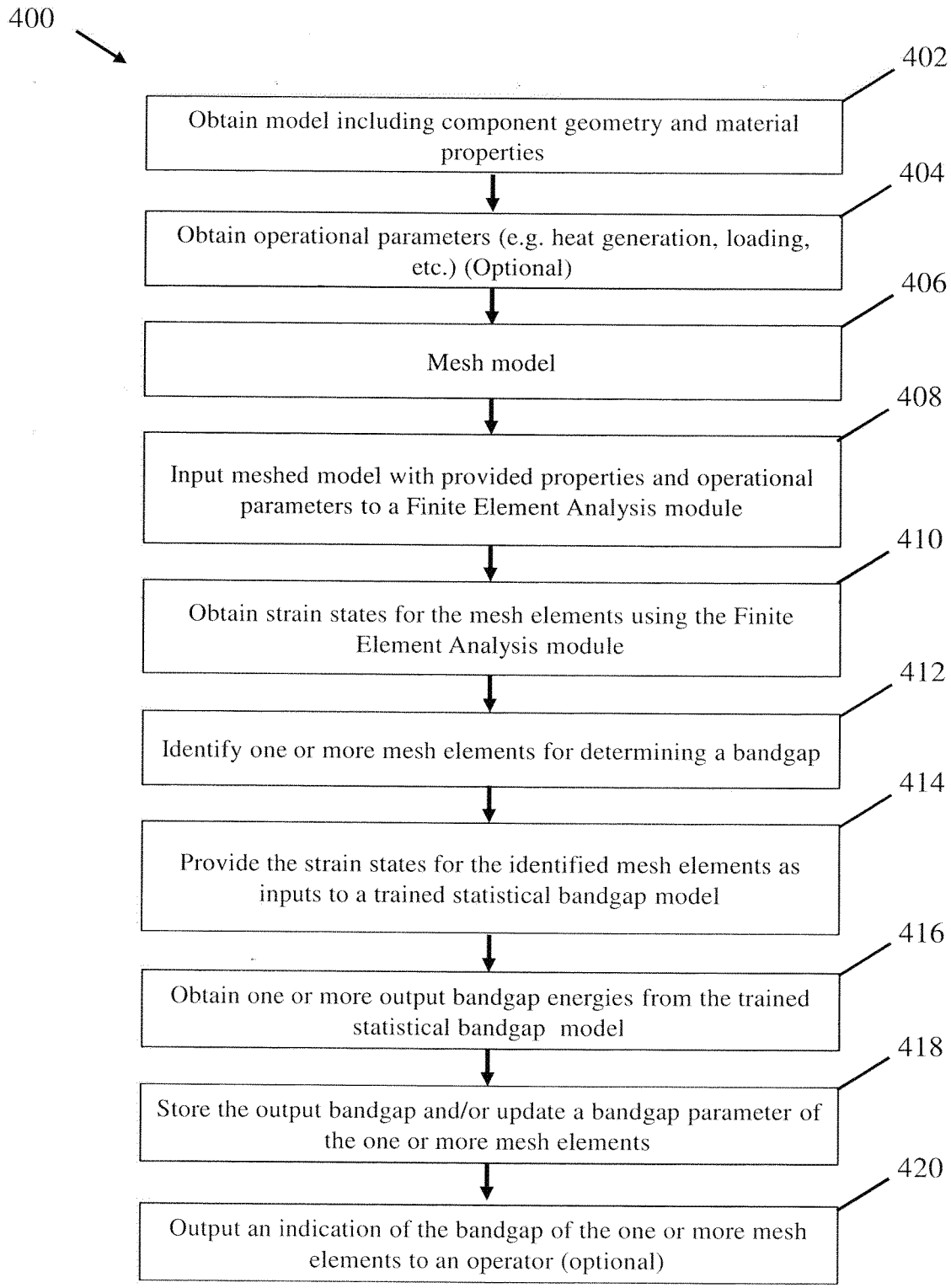
FIG. 8 is a flow diagram of one embodiment for determining the bandgap for a strained component during finite element analysis.
Figure 9:
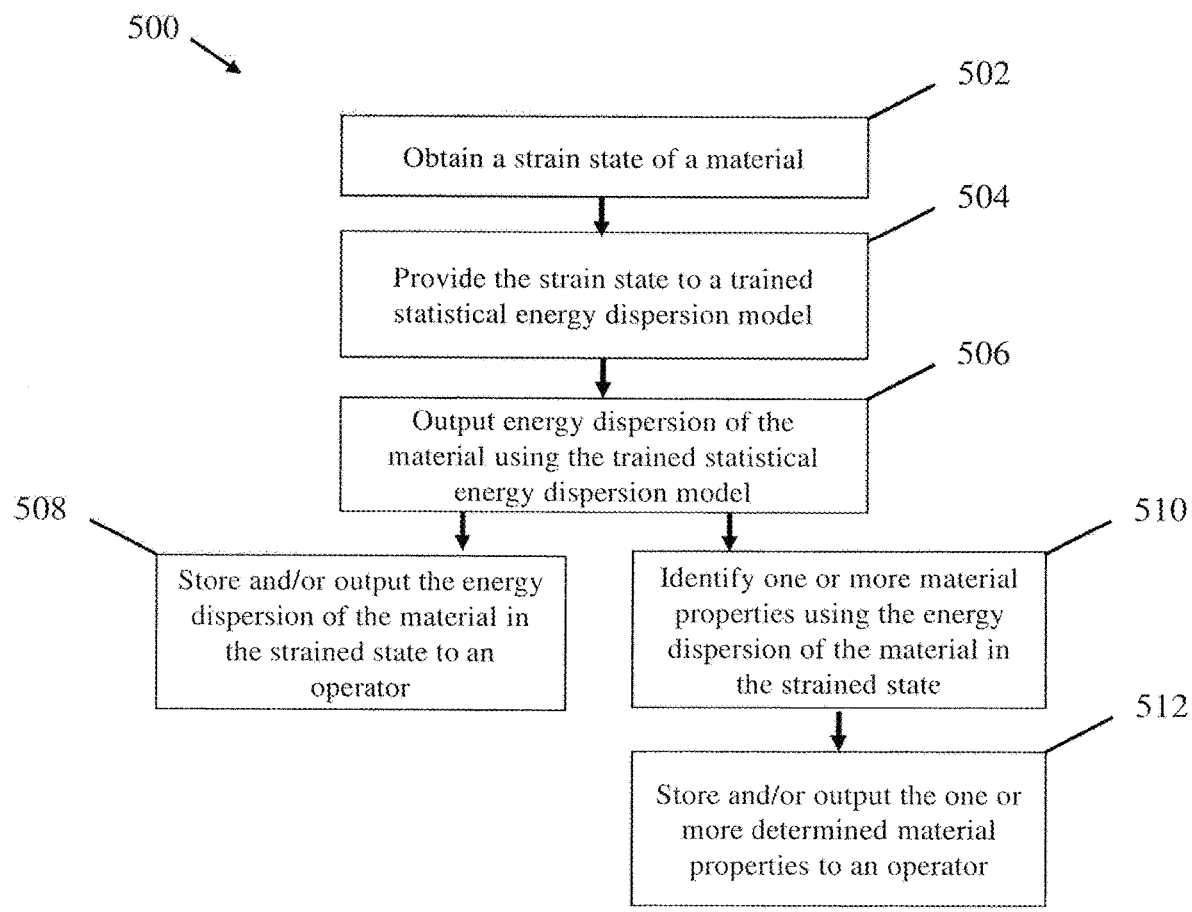
FIG. 9 is a flow diagram of one embodiment of determining the energy dispersion and/or one or more material properties of a material using an energy dispersion model.

FIGS. 7-9 depict several possible uses of a trained statistical model that has been generated for predicting either the bandgap and/or energy dispersion of a material as a function of strains applied to the material. Of course, while several possible uses of a trained statistical model are provided, it should be understood that the currently disclosed trained statistical models are not limited to only these uses and that they may be generally applicable to any use where it is desirable to predict the bandgap, the band structure, and/or any other appropriate property related thereto as a function of a strain applied to a material.

As noted previously, in some instances, the materials for which the currently disclosed trained statistical models may be used may be nanomaterials with characteristic length scales that are less than about 1 µm. Although nanomaterials may be able to support relatively larger elastic strains without inducing plasticity and/or fracture for comparably longer times as compared to macroscale materials, it is still possible at higher strains and/or temperatures, that the applied elastic strains may relax away due to a variety of relaxation mechanisms. The physical limitations also apply to microscale materials, though the relative elastic strains that may be supported may be correspondingly lower as compared to nanoscale materials. Accordingly, in some embodiments, it may be desirable to identify elastic strain coordinates within a range of possible strains that provide a desired bandgap with a minimum corresponding amount of elastic strain energy density. This may help to reduce the possibility of fracture and/or relaxation of the strain of an elastic strain engineered material over time.

FIG. 7 depicts one embodiment of a method 300 of using a trained statistical model to identify a strain of a material with the lowest strain energy density associated with it to provide a desired bandgap. Specifically, at 302 a desired bandgap is obtained. This bandgap may be obtained either by input from a user through an appropriate input device, the bandgap may be provided as a design parameter for a particular application, and/or any other appropriate source as the disclosure is not limited in this fashion. At 304, the desired bandgap may then be provided as an input to a trained statistical bandgap model of a material which, as noted previously, may be a function of the bandgap and strain. The trained statistical bandgap model may output at least one, and in some instances, a set of strain coordinates that when applied will result in the material exhibiting the desired bandgap at 306. In some embodiments, it may be desirable to identify a strain coordinate with the lowest corresponding strain energy density at 308. In some instances, this may be done by evaluating the set of strain coordinates using any appropriate method including following the steepest dissent direction of the calculated strain energy densities associated with the output strain coordinates. Alternatively, in some embodiments, the model may be used to provide gradient and/or curvature information related to a surface formed by the strain coordinates with the same bandgap.

Regardless of how the identification of an elastic strain coordinate with the lowest strain energy density and a desired bandgap is accomplished, after identifying the strain coordinate, the set of strain coordinates and/or the identified strain coordinate with a lowest strain energy density for the desired bandgap may be stored in a non-transitory computer readable medium at 310 for subsequent recall and/or use. Additionally, in some embodiments, at 312 the set of strain coordinates and/or the identified strain coordinate may be output to a user. For example, the set of strain coordinates may be plotted as an isosurface in three-dimensional strain space where each point on the surface has the desired bandgap for visualization purposes by the user. Such a graph may help to visualize the design envelope for strain that the user may work within when designing a component with a desired material property. Alternatively, and/or a combination with this type of output graph, the strain coordinates corresponding to the lowest strain energy density for the desired bandgap may be output to the user as well, either numerically and/or in graphical form.

Due to the complexity and cost associated with the design and manufacture of microelectronic components, it may be desirable to evaluate the bandgap and/or other physical parameters of a material in view of the stresses and strains applied to those materials both when initially manufactured and/or during operation. Accordingly, in some embodiments, it may be desirable to use the disclosed bandgap and/or energy dispersion models described herein in combination with a Finite Element Analysis module for evaluating the resulting properties of material due to strains applied to the material prior to and/or during operation. One such method 400 is shown in FIG. 8 in relation to the use of a trained statistical bandgap model with a Finite Element Analysis module. However, it should be understood that any of the trained statistical models disclosed herein, including an energy dispersion model may also be used in combination with a Finite Element Analysis module as the disclosure is not so limited.

In the depicted method 400, a model including the geometry and material properties of a component may be obtained at 402. Additionally, in instances where it is desirable to evaluate the material properties of the component during operation, one or more operational parameters of the component, and/or an associated system, may be obtained at 404. Appropriate types of operational parameters may include, but are not limited to, heat generation, loading, and/or the appropriate operational parameters. The model may be meshed at 406 using any appropriate mesh strategy to form a plurality of mesh elements. The meshed model including a plurality of mesh elements may be input along with the provided material properties and operational parameters to an associated Finite Element Analysis module at 408. It should be understood than any appropriate method of conducting a Finite Element Analysis may be used as the disclosure is not limited in this fashion. In either case, the strain states for the individual mesh elements may be obtained at 410, using the Finite Element Analysis module.

Once the strain states of the individual mesh elements have been obtained for a component of interest, the bandgaps of one or more identified mesh elements may be determined. Specifically, one or more mesh elements may be identified either prior to and/or after the finite element analysis has been conducted at 412. Depending on the particular embodiment, this identification may either be manually entered by a user using an appropriate input device and/or mesh elements that have been indicated as corresponding to a material that is sensitive to the application of strain may automatically be identified for evaluation of the material properties versus the determined strain states applied to those elements. For example, a meshed model may indicate that one or more elements are formed from a strain sensitive material such as silicon. After determining the applied strain states for the various mesh elements, those mesh elements of the meshed model that correspond to silicon, or another appropriate strain sensitive material, may be automatically identified for determining a bandgap, or other appropriate parameter, of the material.

Once the one or more mesh elements for determining a bandgap have been identified, the strain states for the identified mesh elements may be provided as inputs to a trained statistical bandgap model at 414. One or more corresponding output bandgaps for the individual mesh elements may be output from the trained statistical bandgap model at 416. The output bandgaps for the various mesh elements may then be stored in an appropriate non-transitory computer readable medium for subsequent use and/or the output bandgaps may be used to update a bandgap parameter of the individual associated mesh elements at 418. In some embodiments, an indication of the bandgap of the one or more mesh elements may be output to a user in any appropriate fashion. For example, the determined bandgap, a minimum bandgap, a maximum bandgap, and/or any other appropriate metric of the bandgaps of the mesh elements may be presented to a user in textual and/or graphical form. Alternatively, a graphical representation of the component model may be overlaid with an appropriate indication of the bandgaps using indications such as color gradients and/or intensities to indicate the corresponding bandgaps within a particular portion of the modeled component. Of course, it should be understood that the current disclosure is not limited to how the information is output to a user, and in some instances, the information may not be output to a user.

While a single component has been discussed in relation to the above embodiment, embodiments in which a finite element analysis is applied to an overall assembly including the described component are also contemplated. For example, the component model within the overall assembly model may be identified as being made with a material that is sensitive to strain as described above. Thus, whcln the finite element analysis determines the strains for the various sub-parts within the assembly, including the component made from the strain sensitive material, a trained statistical model may be used to determine one or more properties of the component. Thus, the current disclosure may be applied to either individual components made from various materials of interest and/or to entire assemblies including multiple components as the disclosure is not limited in this fashion.

Again, while the above method has been described relative to the use and application of a trained statistical bandgap model, a Finite Element Analysis module may be used in combination with a trained statistical dispersion energy module as well. For example, the outputs provided by an energy dispersion model may include, but are not limited to, the dispersion energies of the material, a band structure of the material, transitions to between different states, and/or any other appropriate material property.

The above disclosed method provides for the simple, quick, and accurate determination of the both the strain state and corresponding changes in material properties for a component which in combination provide a powerful tool for design purposes of elastic strain engineered components.

FIG. 9 illustrates a method of use 500 of a trained statistical energy dispersion model of a material. In the depicted embodiment, a strain state of a material may be obtained at 502. Again, the particular strain coordinates associated with the strain state may be obtained in any appropriate fashion, including input from a user, a strain state determined using a finite element analysis module, experimental data, and/or any other appropriate source of the desired information. Regardless of how the strain state is obtained, it may be provided to a trained statistical energy dispersion model at 504. The trained statistical energy dispersion model may output the energy dispersion of the strained material at 506. As noted above, the energy dispersion of the material may also be referred to as the band structure of the material. In some embodiments, the energy dispersion of the strained material may either be stored in a non-transitory computer readable medium for future use and/or the energy dispersion of material may be output to a user at 508. For example, the energy dispersion of the strained material may be plotted on a graph for visualization purposes of the band structure of the strained material by a user. Alternatively, in some embodiments, the output energy dispersion of the material may be used to identify one or more material properties of the material in the strained state at 510 as described further below. The one or more identified material properties may be stored on a non-transitory computer readable medium for future use and/or they may be output to a user at 512 using either textual and/or graphical presentations.

The above noted energy dispersion, i.e., band structure, of a material subjected to an elastic strain may be useful in multiple contexts. For example, simply plotting the energy dispersion of the strained material and outputting it to a user for visualization purposes may permit the user to study and explore the electronic behavior and properties of the elastically strained material using first-principal understandings of this material provided by such a visualization. Currently, such a process is unable to be done without extreme effort for every strain state of interest. In contrast, the disclosed method may be accomplished easily and quickly for a number of different possible strain states using the trained statistical models disclosed herein. Additionally, by generating the energy dispersion data associated with a material in an elastically strained state, it is possible to identify certain material property transitions and characteristics quickly and easily. For example, by examining where the conduction band minimum and the valence band maximum are located within the energy dispersion data, it is possible to identify the bandgap of the material, transitions from direct to indirect bandgaps, as well as providing information on various band properties such as the electron band, phonon band, magnon band, and other appropriate characteristics of the strained material through a straight forward analysis of the energy dispersion of the material. Again, this type of analysis and information may be either stored and/or output to a user. Alternatively, this type of analysis information may be combined with finite element analysis, and/or other appropriate types of analyses, to provide enhanced functionality relative to the information available to a user regarding the design and operation of a system.

The above-described embodiments of the technology described herein can be implemented in any of numerous ways. For example, the embodiments may be implemented using hardware, software or a combination thereof. When implemented in software, the software code can be executed on any suitable processor or collection of processors, whether provided in a single computing device or distributed among multiple computing devices. Such processors may be implemented as integrated circuits, with one or more processors in an integrated circuit component, including commercially available integrated circuit components known in the art by names such as CPU chips, GPU chips, microprocessor, microcontroller, or co-processor. Alternatively, a processor may be implemented in custom circuitry, such as an ASIC, or semicustom circuitry resulting from configuring a programmable logic device. As yet a further alternative, a processor may be a portion of a larger circuit or semiconductor device, whether commercially available, semi-custom or custom. As a specific example, some commercially available microprocessors have multiple cores such that one or a subset of those cores may constitute a processor. Though, a processor may be implemented using circuitry in any suitable format.

Further, it should be appreciated that a computing device may be embodied in any of a number of forms, such as a rack-mounted computer, a desktop computer, a laptop computer, or a tablet computer. Additionally, a computing device may be embedded in a device not generally regarded as a computing device but with suitable processing capabilities, including a Personal Digital Assistant (PDA), a smart phone, tablet, or any other suitable portable or fixed electronic device.

Also, a computing device may have one or more input and output devices. These devices can be used, among other things, to present a user interface. Examples of output devices that can be used to provide a user interface include display screens for visual presentation of output and speakers or other sound generating devices for audible presentation of output. Examples of input devices that can be used for a user interface include keyboards, individual buttons, and pointing devices, such as mice, touch pads, and digitizing tablets. As another example, a computing device may receive input information through speech recognition or in other audible format.

Such computing devices may be interconnected by one or more networks in any suitable form, including as a local area network or a wide area network, such as an enterprise network or the Internet. Such networks may be based on any suitable technology and may operate according to any suitable protocol and may include wireless networks, wired networks or fiber optic networks.

Also, the various methods or processes outlined herein may be coded as software that is executable on one or more processors that employ any one of a variety of operating systems or platforms. Additionally, such software may be written using any of a number of suitable programming languages and/or programming or scripting tools, and also may be compiled as executable machine language code or intermediate code that is executed on a framework or virtual machine.

In this respect, the embodiments described herein may be embodied as a computer readable storage medium (or multiple computer readable media) (e.g., a computer memory, one or more floppy discs, compact discs (CD), optical discs, digital video disks (DVD), magnetic tapes, flash memories, RAM, ROM, EEPROM, circuit configurations in Field Programmable Gate Arrays or other semiconductor devices, or other tangible computer storage medium) encoded with one or more programs that, when executed on one or more computers or other processors, perform methods that implement the various embodiments discussed above. As is apparent from the foregoing examples, a computer readable storage medium may retain information for a sufficient time to provide computer-executable instructions in a non-transitory form. Such a computer readable storage medium or media can be transportable, such that the program or programs stored thereon can be loaded onto one or more different computing devices or other processors to implement various aspects of the present disclosure as discussed above. As used herein, the term "computer-readable storage medium" encompasses only a non-transitory computer-readable medium that can be considered to be a manufacture (i.e., article of manufacture) or a machine. Alternatively or additionally, the disclosure may be embodied as a computer readable medium other than a computer-readable storage medium, such as a propagating signal.

The terms "program" or "software" are used herein in a generic sense to refer to any type of computer code or set of computer-executable instructions that can be employed to program a computing device or other processor to implement various aspects of the present disclosure as discussed above. Additionally, it should be appreciated that according to one aspect of this embodiment, one or more computer programs that when executed perform methods of the present disclosure need not reside on a single computing device or processor, but may be distributed in a modular fashion amongst a number of different computers or processors to implement various aspects of the present disclosure.

Computer-executable instructions may be in many forms, such as program modules, executed by one or more computers or other devices. Generally, program modules include routines, programs, objects, components, data structures, etc. that perform particular tasks or implement particular abstract data types. Typically the functionality of the program modules may be combined or distributed as desired in various embodiments.

The embodiments described herein may be embodied as a method, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Further, some actions are described as taken by a "user." It should be appreciated that a "user" need not be a single individual, and that in some embodiments, actions attributable to a "user" may be performed by a team of individuals and/or an individual in combination with computer-assisted tools or other mechanisms.

Figure 10:
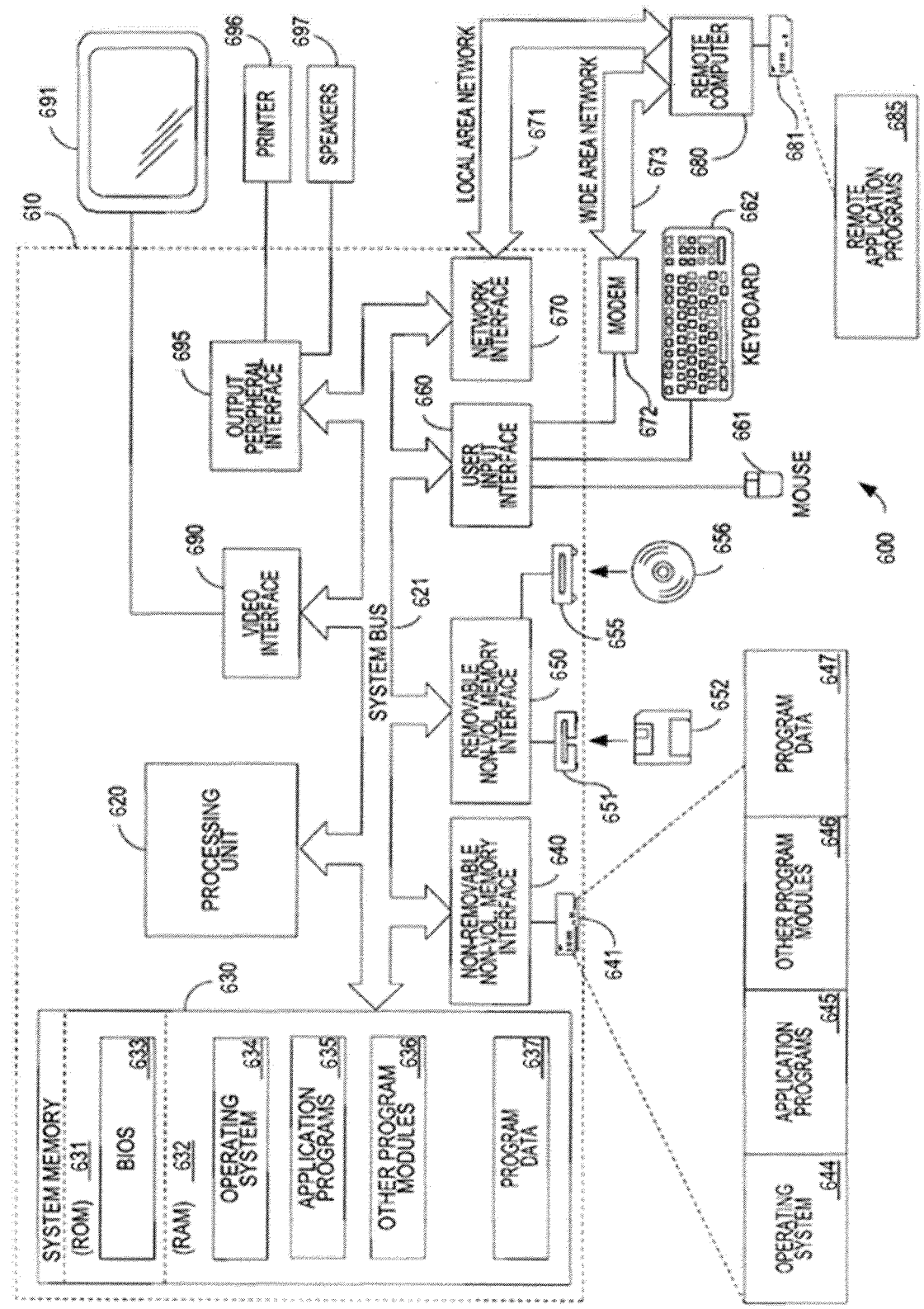
FIG. 10 is a schematic embodiment of a system for training and/or implementing the models disclosed herein.

With reference to FIG. 10, an exemplary system for implementing aspects of the invention includes a general purpose computing device in the form of a computer 610. Components of computer 610 may include, but are not limited to, a processing unit 620, a system memory 630, and a system bus 621 that couples various system components including the system memory to the processing unit 620. The system bus 621 may be any of several types of bus structures including a memory bus or memory controller, a peripheral bus, and a local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus also known as Mezzanine bus.

Computer 610 typically includes a variety of computer readable media. Computer readable media can be any available media that can be accessed by computer 610 and includes both volatile and nonvolatile media, removable and non-removable media. By way of example, and not limitation, computer readable media may comprise computer storage media and communication media. Computer storage media includes both volatile and nonvolatile, removable and non-removable media implemented in any method or technology for storage of information such as computer readable instructions, data structures, program modules or other data. Computer storage media includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which can be used to store the desired information and which can accessed by computer 610. Communication media typically embodies computer readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. Combinations of the any of the above should also be included within the scope of computer readable media.

The system memory 630 includes computer storage media in the form of volatile and/or nonvolatile memory such as read only memory (ROM) 631 and random access memory (RAM) 632. A basic input/output system 633 (BIOS), containing the basic routines that help to transfer information between elements within computer 610, such as during start-up, is typically stored in ROM 631. RAM 632 typically contains data and/or program modules that are immediately accessible to and/or presently being operated on by processing unit 620. By way of example, and not limitation, FIG. 10 illustrates operating system 634, application programs 635, other program modules 636, and program data 637.

The computer 610 may also include other removable/non-removable, volatile/nonvolatile computer storage media. By way of example only, FIG. 10 illustrates a hard disk drive 641 that reads from or writes to non-removable, nonvolatile magnetic media, a magnetic disk drive 651 that reads from or writes to a removable, nonvolatile magnetic disk 652, and an optical disk drive 655 that reads from or writes to a removable, nonvolatile optical disk 656 such as a CD ROM or other optical media. Other removable/non-removable, volatile/nonvolatile computer storage media that can be used in the exemplary operating environment include, but are not limited to, magnetic tape cassettes, flash memory cards, digital versatile disks, digital video tape, solid state RAM, solid state ROM, and the like. The hard disk drive 641 is typically connected to the system bus 621 through an non-removable memory interface such as interface 640, and magnetic disk drive 651 and optical disk drive 655 are typically connected to the system bus 621 by a removable memory interface, such as interface 650.

The drives and their associated computer storage media discussed above and illustrated in FIG. 10, provide storage of computer readable instructions, data structures, program modules and other data for the computer 610. In FIG. 10, for example, hard disk drive 641 is illustrated as storing operating system 644, application programs 645, other program modules 646, and program data 647. Note that these components can either be the same as or different from operating system 634, application programs 635, other program modules 636, and program data 637. Operating system 644, application programs 645, other program modules 646, and program data 647 are given different numbers here to illustrate that, at a minimum, they are different copies. A user may enter commands and information into the computer 610 through input devices such as a keyboard 662 and pointing device 661, commonly referred to as a mouse, trackball or touch pad. Other input devices (not shown) may include a microphone, joystick, game pad, satellite dish, scanner, or the like. These and other input devices are often connected to the processing unit 620 through a user input interface 660 that is coupled to the system bus, but may be connected by other interface and bus structures, such as a parallel port, game port or a universal serial bus (USB). A monitor 691 or other type of display device is also connected to the system bus 621 via an interface, such as a video interface 690. In addition to the monitor, computers may also include other peripheral output devices such as speakers 697 and printer 696, which may be connected through a output peripheral interface 695.

The computer 610 may operate in a networked environment using logical connections to one or more remote computers, such as a remote computer 680. The remote computer 680 may be a personal computer, a server, a router, a network PC, a peer device or other common network node, and typically includes many or all of the elements described above relative to the computer 610, although only a memory storage device 681 has been illustrated in FIG. 10. The logical connections depicted in FIG. 10 include a local area network (LAN) 671 and a wide area network (WAN) 673, but may also include other networks. Such networking environments are commonplace in offices, enterprise-wide computer networks, intranets and the Internet.

When used in a LAN networking environment, the computer 610 is connected to the LAN 671 through a network interface or adapter 670. When used in a WAN networking environment, the computer 610 typically includes a modem 672 or other means for establishing communications over the WAN 673, such as the Internet. The modem 672, which may be internal or external, may be connected to the system bus 621 via the user input interface 660, or other appropriate mechanism. In a networked environment, program modules depicted relative to the computer 610, or portions thereof, may be stored in the remote memory storage device. By way of example, and not limitation, FIG. 10 illustrates remote application programs 685 as residing on memory device 681. It will be appreciated that the network connections shown are exemplary and other means of establishing a communications link between the computers may be used.

The various methods or processes outlined herein may be implemented in any suitable hardware. Additionally, the various methods or processes outlined herein may be implemented in a combination of hardware and of software executable on one or more processors that employ any one of a variety of operating systems or platforms. For example, the various methods or processes may utilize software to instruct a processor to activate one or more actuators to perform motions such as those described herein, such as motion of one or more regions of a container and/or of a build platform. Examples of such approaches are described above. However, any suitable combination of hardware and software may be employed to realize any of the embodiments discussed herein.

In this respect, various inventive concepts may be embodied as at least one non-transitory computer readable storage medium (e.g., a computer memory, one or more floppy discs, compact discs, optical discs, magnetic tapes, flash memories, circuit configurations in Field Programmable Gate Arrays or other semiconductor devices, etc.) encoded with one or more programs that, when executed on one or more computers or other processors, implement the various embodiments of the present invention. The non-transitory computer-readable medium or media may be transportable, such that the program or programs stored thereon may be loaded onto any computer resource to implement various aspects of the present invention as discussed above.

The terms "program" or "software" are used herein in a generic sense to refer to any type of computer code or set of computer-executable instructions that can be employed to program a computer or other processor to implement various aspects of embodiments as discussed above. Additionally, it should be appreciated that according to one aspect, one or more computer programs that when executed perform methods of the present invention need not reside on a single computer or processor, but may be distributed in a modular fashion among different computers or processors to implement various aspects of the present invention.

Computer-executable instructions may be in many forms, such as program modules, executed by one or more computers or other devices. Generally, program modules include routines, programs, objects, components, data structures, etc. that perform particular tasks or implement particular abstract data types. Typically, the functionality of the program modules may be combined or distributed as desired in various embodiments.

Various inventive concepts may be embodied as one or more methods, of which examples have been provided. For example, systems and methods for generating and using trained statistical models have been provided herein. The acts performed as part of any method described herein may be ordered in any suitable way. Accordingly, embodiments may be constructed in which acts are performed in an order different than illustrated, which may include performing some acts simultaneously, even though these acts may have been shown as sequential acts in illustrative embodiments.

Example: Summary

As demonstrated below, systematic machine learning can make the problem of representing the electronic bandstructure of a material as a function of six-dimensional strain computationally possible. Specifically, a number of general methods for surrogate modeling of a bandstructure $\varepsilon_n(k;E)$ which, relying on a limited amount of data from ab initio calculations, can be used to fit the properties of a material with sufficient accuracy. In particular, an artificial neural network detailed below was able to predict the bandstructure of strained silicon within an accuracy of 19 meV. The trained statistical models were also utilized to discover the indirect-to-direct bandgap transition and semiconductor-to-semimetal transition in silicon over the entire strain space. Additionally, for the first time, a chart of pure silicon bandgap distribution as a function of elastic strain energy density was obtained.

Example: Methodology

The first-principle calculations presented in the following examples were calculated using the Perdew-Burke-Ernzerhof (PBE) exchange-correlational functional and the projector augmented wave method (PAW) for density functional theory (DFT) simulations. The DFT simulations were implemented in the Vienna Ab initio Simulation Package. A plane wave basis set with an energy cutoff of 520 eV was adopted to expand the electronic wavefunctions. The Brillouin zone integration was conducted on a 13×13×13 Monkhorst-Pack k-point mesh (7×7×7 for GW calculations). Atomic coordinates in all the structures were relaxed until the maximum residual force was below 0.0005 eV Å$^{-1}$.

Neural network (NN) fitting was implemented within the Tensorflow framework. To predict the bandgaps, deep neural networks with four hidden layers with a (64-128-256-256) structure were used in the case of non-shear strains and a (512-256-256-256) structure was used for cases with shear strains. For the more complicated task of band energy prediction at a single k-point, the architecture of (512-256-256-256) was used. The leaky rectified linear unit was chosen as an activation function. The Adam stochastic optimization method, the orthogonal weight initialization, and the dropout technique were used to prevent overfitting.

In addition to neural networks, ensemble-based machine-learning methods were also used for comparison purposes with the neural network models. For most of the algorithms, scikit-learn implementations were used. For the regression task, two types of ensembling on decision trees were used: the random forest algorithm and the gradient boosting regression. For most of the fitting methods, hyper-parameters were tuned using cross-validation on a training set. This helped to enhance these ensemble methods.

Example: Modeling of Silicon

The bandstructure of silicon $\varepsilon_n(k;\varepsilon)$ was modeled, where n is the band index, k is the wavevector and $\varepsilon$ is the crystal strain tensor. This model was obtained using the first-principles density functional theory (DFT) by training machine learning models with training data obtained using first-principles. The main advantages of this approach are reduced "data hunger" since training of of the machine learning module model (i.e. statistical model) required much less data than other methods such as fine-grid ab initio calculations. As detailed further below, this method also provided reasonable accuracy in combination with fast evaluation times for any desired combination of strain coordinates once the data was collected and the model was trained. Thus, it was possible to do visualization and optimization tasks very rapidly.

For modeling purposes, the applied strains were described by applying a 3×3 tensor transformation to the perfect Si primitive cell (2 atoms) to avoid the confounding effect of band folding in larger supercells which causes difficulty in identifying phenomena such as indirect-to-direct bandgap transition. To avoid redundant computations, each strain applied to a crystal was confirmed to have a one-to-one correspondence to a distinct deformation case. The non-translational part of a homogeneous deformation of a crystal was defined by a second-order deformation gradient tensor F.

$$F = \begin{pmatrix} F_{11} & F_{12} & F_{13} \\ 0 & F_{22} & F_{23} \\ 0 & 0 & F_{33} \end{pmatrix}$$

Since the bandstructure does not change upon rotations of the crystal. Thus, it was possible to eliminate the rotational degrees of freedom by assuming that F is upper triangular. The relationship between the symmetric strain tensor E and F is given by:

$$\varepsilon = \tfrac{1}{2}(F+F^T)-I$$

Using the above assumptions, the bandgap behavior in the case of non-shear deformation ($\varepsilon^{3D}$) was studied with strain components applied along the principle strain directions. The DFT calculations to obtain a training data set were based on two settings: a computationally inexpensive PBE-PAW method for fitting and an accurate, though more computationally expensive, GW model (G, Green's function; W, screened Coulomb interaction) for correction. Ensemble methods on decision tree classifiers including gradient boosting regression (GBR) and random forest regression (RFR) as well as artificial neural networks (ANN) were used for comparing different machine learning fitting methods as detailed previously above. The best results were attained by the neural network models, which also had faster evaluation times. It is worthwhile to emphasize that this approach can be generalized to the case of a 6D strain tensor ($\varepsilon^{6D}$) with non-vanishing off-diagonal shear values. The corresponding model had a root mean square error of 0.07 eV as discussed below relative to the dependence of the elastic strain energy density vs. bandgap. Table 1 below lists the root mean squared error (RMSE) for various machine learning algorithms for the bandgap prediction and energy prediction tasks trained using the calculated PBE training data (units in eV). A Lagrange polynomial of degree 9 was used for comparison purposes.

TABLE 1

| Machine Learning Input | | ML algorithms | | | | ML target |
|---|---|---|---|---|---|---|
| | | Lagrange | GBR | RFR | ANN | |
| $\varepsilon^{3D}$ | | 0.0150 | 0.0367 | 0.0247 | 0.0049 | Bandgap |
| $\varepsilon^{6D}$ | | — | 0.0743 | 0.0781 | 0.0264 | |
| k-point and $\varepsilon^{3D}$ | VB | — | 0.1125 | 0.1078 | 0.0131 | Energy dispersion, $\varepsilon_n(k; \varepsilon)$ |
| | CB | — | 0.1593 | 0.1555 | 0.0184 | |

After obtaining a very accurate model for the PBE-PAW data by neural network, the difference between this model and data calculated by GW as a function of a strain and PBE bandgap was fit with a second neural network model, resulting in an accurate model comparable to the experimental data. This approach is also known as delta machine learning or data fusion. Due to the extremely high computational cost of GW, the Lagrange interpolation (since it requires much fewer data points) was compared with the other machine learning algorithms. Here, a Lagrange polynomial of degree 8 was used. The models were validated on a separately obtained GW test data set. It was shown that GW bandgap in $\varepsilon^{3D}$ strain case can be approximated within an accuracy of 8 meV. In Table 2 below, the mean absolute error (MAE) and root mean square error (RMSE) are shown for trained statistical models for GBR, RFR, and ANN for bandgap versus strain based on the GW data only (without the PBE data) and the GW data combined with the PBE data. Use of the GW data by itself yielded a similar yet worse accuracy. The relative error of the ANN is also presented in the tables where the relative error is the norm of the difference between the true value and the prediction divided by the norm of the true value. To reduce the number of data points used, one may utilize other classes of models, such as Gaussian Processes, that can possibly achieve comparable accuracy and the amount of data used with an adaptive design of experiments or active learning.

TABLE 2

| ML algorithms | GW | | GW + PBE | |
|---|---|---|---|---|
| | MAE | RMSE | MAE | RMSE |
| Lagrange | 0.0211 | 0.0274 | 0.0186 | 0.0241 |
| GBR | 0.0334 | 0.0521 | 0.0135 | 0.0209 |
| RFR | 0.0434 | 0.0596 | 0.0145 | 0.0215 |
| ANN | 0.0099 | 0.0144 | 0.0080 | 0.0118 |
| ANN relative error | 1.72% | 2.78% | 1.38% | 2.05% |

Figure 11:
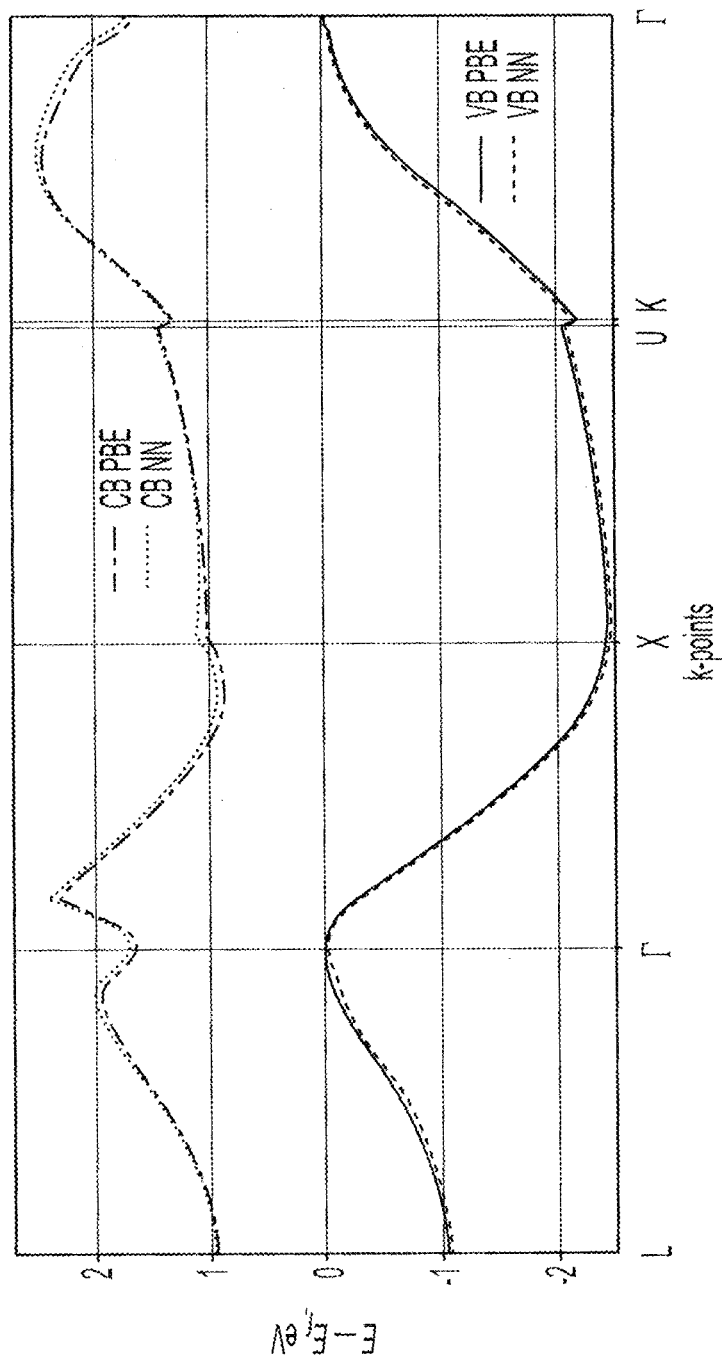
FIG. 11 is a graph comparing the calculated and model fitted valence band and conduction band energies.

FIG. 11 shows a comparison between calculated energy dispersion data and results from a fit model using this training data. Specifically, the DFT-PBE calculated data is shown in solid lines for the top valence band (VB) and lowest conduction band (CB) for silicon deformed at $\varepsilon_1=7\%$, $\varepsilon_2=4\%$, $\varepsilon_3=4\%$. The highly effective fit from the resulting trained statistical model are shown as dashed lines. As shown in the figure, the statistical model illustrates a high degree of accuracy.

Figure 12A:
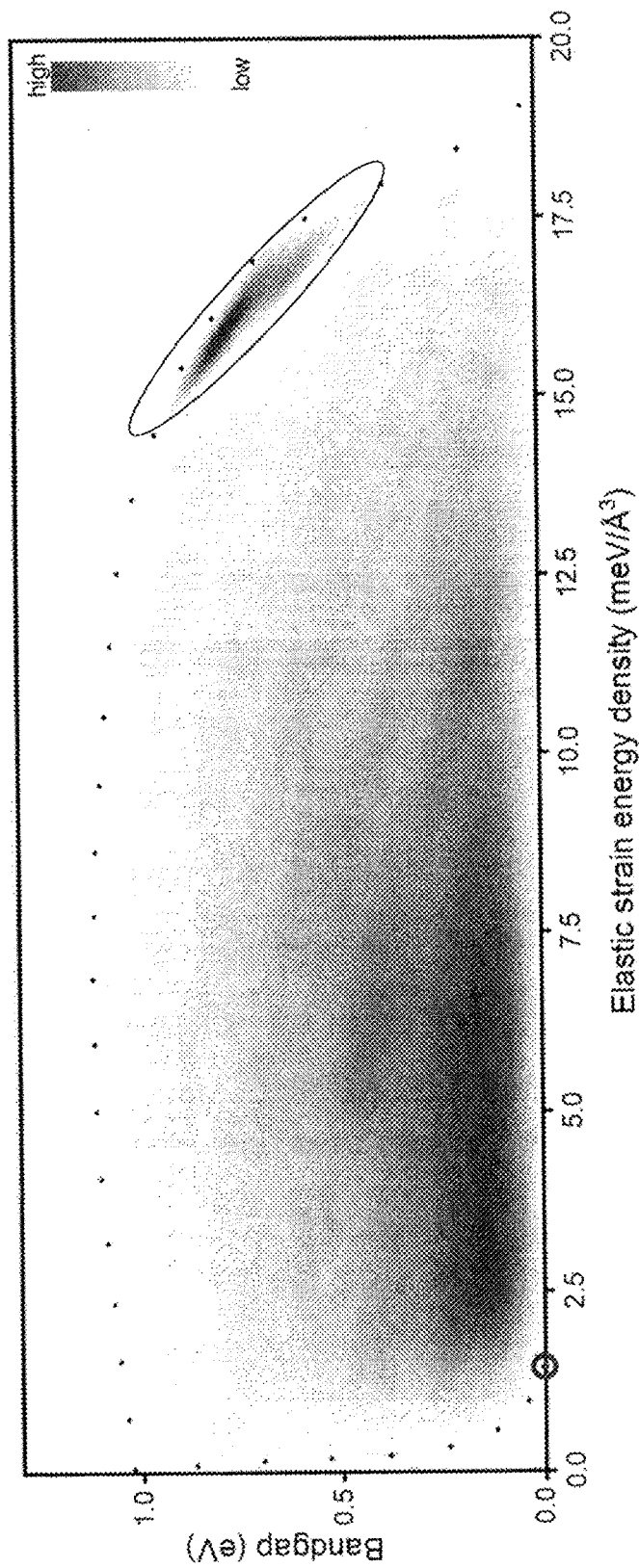
FIG. 12A is a graph of bandgap versus elastic strain energy density for silicon with the region encircled with an oval indicating the direct bandgap region for silicon.

In elastic strain engineering experiments, researchers are often concerned about what is the highest or lowest bandgap that can be achieved if one is willing to pay the price measured in certain elastic strain energy density (h) defined as:

$$h(\varepsilon) = \frac{E(\varepsilon) - E^0}{V^0}, \quad (1)$$

where $E(\varepsilon)$ is the total energy of the cell deformed by strain $\varepsilon$, and $E^0$ and $V^0$ are the total energy and volume of the undeformed cell. Here, the 6D deformations are modeled using machine learning of the bandgap distribution as a function of the elastic strain energy density. The many-to-many relation between $h(\varepsilon)$ and the bandgap is shown in FIG. 12A. As detailed further below, the figure depicts the reachable bandgap values for various elastic strain energy densities h within the whole deformation space. The strain region where the strained silicon has a direct bandgap is circled by the elongated oval. The circle on the horizontal axis indicates the lowest energy penalty for semiconductor-to-semimetal transition, which corresponds to the deformation case of $\varepsilon_{11}=0.55\%$, $\varepsilon_{12}=1.69\%$, $\varepsilon_{13}=0.74\%$, $\varepsilon_{21}=1.69\%$, $\varepsilon_{22}=-1.26\%$, $\varepsilon_{23}=-1.92\%$, $\varepsilon_{31}=0.74\%$, $\varepsilon_{32}=-1.92\%$, and $\varepsilon_{33}=-1.04\%$. In the stress-free equilibrium state, silicon has a bandgap of 1.1 eV. However, with increasing strain energy density, a variety of possible bandgaps may be sampled. Even a metastable silicon with as little strain energy density as 0.2 meV/$A^3$ would therefore be a very different material from the stress-free silicon. As h further increases, the allowable range of bandgap drops and an "envelope" eventually forms, as evidenced by the change of maximal and minimal bandgap reachable under a fixed h illustrated in the figure.

The shading of the region in FIG. 12A reflects the distribution of the available bandgap. Mathematically, the cumulant "density of states" of bandgap (cDOB) may be defined as the following:

$$c(E_g'; h') \equiv \int_{h(\varepsilon) < h'} d^6\varepsilon \delta(E_g' - E_g(\varepsilon)) = \int d^6\varepsilon \delta(E_g' - E_g(\varepsilon)) H(h' - h(\varepsilon)) \quad (2)$$

where $d^6\varepsilon \equiv d\varepsilon_1 d\varepsilon_2 d\varepsilon_3 d\varepsilon_4 d\varepsilon_5 d\varepsilon_6$ is the measure in the 6-dimensional strain-space, $\delta(\cdot)$ is the Dirac delta function, and $H(\cdot)$ is the Heaviside step function. The "density of states" of bandgap (DOB) at h' is then defined by taking derivative of the cumulant with respect to h':

$$\rho(E_g'; h') \equiv \frac{\partial c(E_g'; h')}{\partial h'} = \int d^6\varepsilon \delta(E_g' - E_g(\varepsilon))\delta(h' - h(\varepsilon)) \quad (3)$$

Figure 12C:
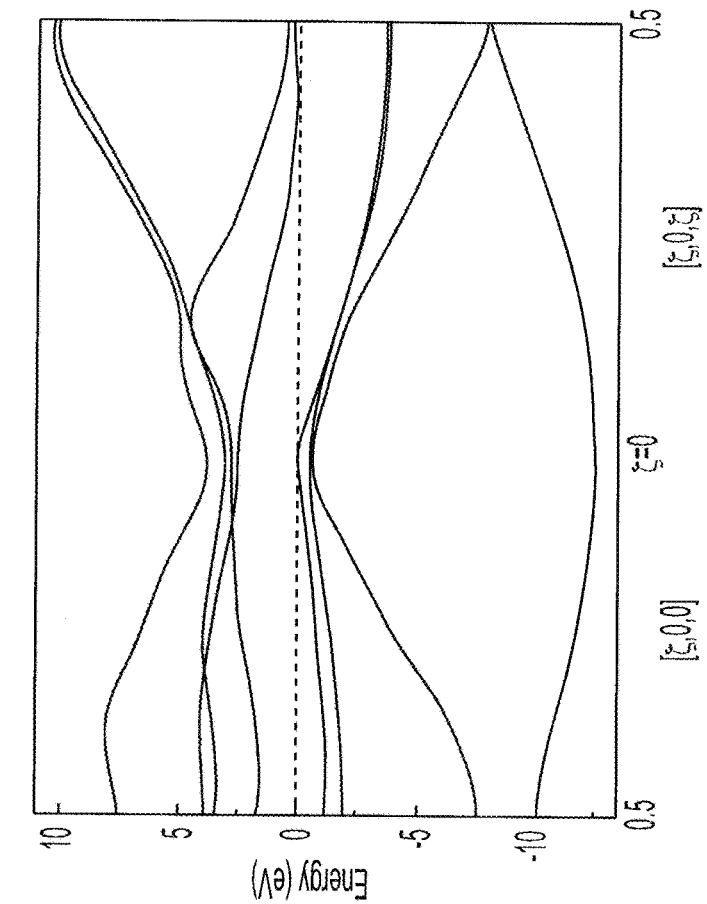
FIG. 12C is a graph of the band structure associated with the deformation shown in FIG. 12B.
Figure 12B:
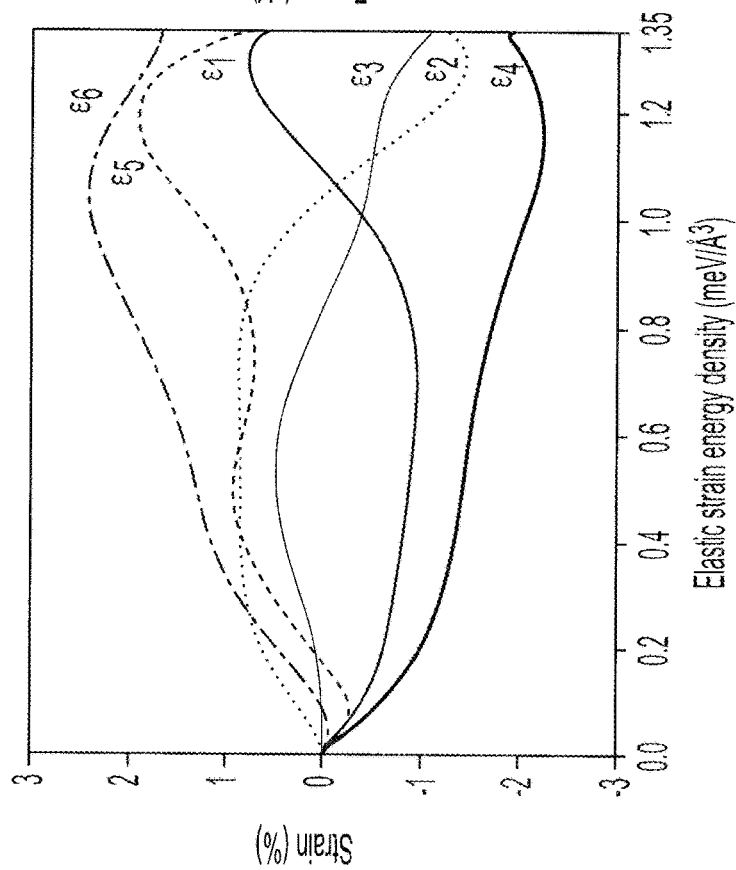
FIG. 12B is a graph of the strain versus elastic strain energy density for the steepest descent strain direction to reach the zero bandgap state indicated by the circle on the horizontal axis in FIG. 12A.

The meaning of DOB is as follows: provided one is willing to consider elastically strained states within the $$\left(h - \frac{dh}{2}, h + \frac{dh}{2}\right)$$

energy interval, the distribution of bandgaps that these states provide may be determined. The DOB function $\rho(E_g;h)$ offers a blueprint to what bandgaps are accessible at what energy cost. One can use the definition (3) not only for the electronic bandgap, but also generally for any scalar properties (e.g. thermal conductivity, superconducting temperature, etc.), that provides a road map for deep elastic strain engineering, as shown in FIG. 12A. Thus, an upper-envelope function $E_g^{upper}(h)$ and lower-envelope function $E_g^{lower}(h)$ based on $\rho(E_g;h)$ may be defined where:

$$E_g^{upper}(h) = \max \operatorname{supp}_{E_g}(\rho(E_g;h)), E_g^{lower}(h) = \min \operatorname{supp}_{E_g}(\rho(E_g;h)), \quad (4)$$

which are rendered as the upper and lower dotted lines in FIG. 12A, so the non-zero density of bandgaps falls within ($E_g^{lower}$(h), $E_g^{upper}$(h)). In deep elastic strain engineering, $E_g^{lower}$(h) also indicates the 6D steepest descent strain direction to obtain a certain figure of merit. For instance, if one wants to reduce the bandgap of silicon from 1.1 eV as fast as possible, or with the least cost of elastic energy, FIG. 12B illustrates the strain along the steepest descent strain direction to reach this zero-bandgap state, ie. the lower-envelope function. The whole bandgap envelope may thus be viewed as analogous to the "flight envelope" used in aerodynamics to describe the allowable Mach number at a given atmospheric density (altitude) for an aircraft. Thus, for the first time, the shape of the silicon bandgap, and even the band structure itself, across the entire range of possible strains is easily and quickly available for elastic strain engineering of this material.

Using the above statistical model it is also possible to determine the least energy to transition silicon from an indirect to a direct bandgap material. Specifically, silicon strained by a strain tensor of:

$$\begin{pmatrix} 9.2\% & 0 & 0 \\ 0 & 9.2\% & 0 \\ 0 & 0 & 9.2\% \end{pmatrix}$$

transitions from an indirect to a direct bandgap material. This strain tensor is an equil-triaxial tension of 9.2% applied to silicon along the above described x, y, and z-axis (i.e. along silicon crystallographic [100], [010], and [001] directions) simultaneously, ie. an equal amount of expansion in all three directions at the same time. During such an embodiment, the cubic symmetry of the original silicon still holds.

It is seen that, with an application of relatively minor amount of mechanical energy, the overall distribution of pure Si bandgap shifts downward. This means that by adjusting the strain (shear/tensile/compressive) in multiple directions, silicon would tend to absorb a quite different part of the electromagnetic spectrum than the stress-free state. It was also found that at 1.35 meV/Å$^3$ the bandgap hits zero, corresponding to the minimum energy required for semiconductor-to-semimetal transition in the whole 6D strain space, see FIG. 12C for the predicted band structure at the corresponding strain. In view of the above, deep elastic engineering provides an opportunity to reduce a materials bandgap. Additionally, for optical applications, another question is whether a bandgap is direct or indirect. This direct bandgap envelope will be a subset embedded within the DOB. Thus, in some embodiments, a density of direct bandgaps (cDODB) may be defined in parallel to (2), (3), (4), but with $E_{direct\,g}$ instead of $E_g$, to obtain cDODB $\rho_d(E_{direct\,g};h)$ and its bounds $E_{direct\,g}^{upper}$(h), $E_{direct\,g}^{lower}$(h). If direct bandgaps exist at any strain, for that strain there will be $$(E_{direct\,g}^{lower}(h), E_{direct\,g}^{upper}(h)) \subseteq (E_g^{lower}(h), E_g^{upper}(h)). \quad (5)$$

The trained statistical models described herein found within experimentally accessible strain range that the indirect-to-direct bandgap transition takes place in silicon in the high h region and a minimum strain energy density $h_d^{min}$ of 15 meV/Å$^3$ exists for the direct bandgap to show up (the region circled by an oval in FIG. 12A):

$$h_d^{min} = \min\,\mathrm{supp}_h(E_{direct\,g}^{upper}(h) - E_{direct\,g}^{lower}(h)). \quad (6)$$

Figure 13:
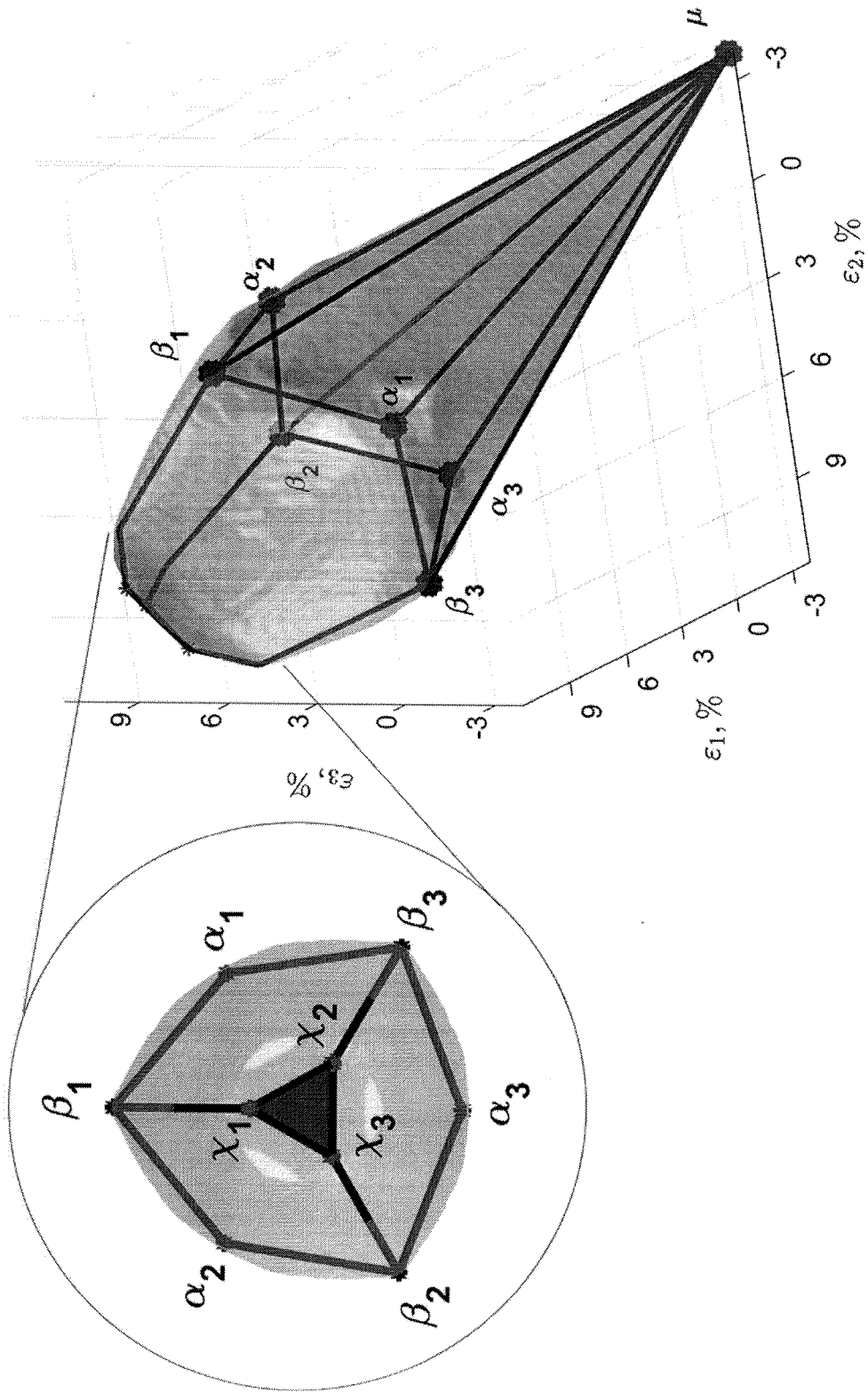
FIG. 13 is a graph of bandgap isosurfaces plotted against strain.

In view of the presented results, it is apparent that different strains may result in the same bandgap, and in a race for a specific bandgap value one may wish to choose the strain states with lower energies. As an example, the same PBE bandgap of 0.7 eV may be reached by applying a triaxial strain of 2.5% and 7.3%; here, the smaller strain (with h=1.31 meV/Å$^3$) would be easier to implement in a real-world experiment and/or design than a larger one (h=5.13 meV/Å$^3$). While a set of the reachable bandgap values in the full 6D strain space does not allow for an explicit visualization, it is possible to explore the accessible electronic bandgap range directly if the possible strains are restricted to tensile and compressive strains ($\varepsilon_4=\varepsilon_5=\varepsilon_6=0$). FIG. 13 illustrates bandgap isosurfaces plotted against a three-dimensional strain space for a bandgap of 0.9 eV. The isosurfaces represent the set of points in the strain space where the bandgap is equal to a given value, for different levels obtained by a high-throughput trained neural network model. Since both the crystal structure and deformation tensor have some symmetries, and the bandgap as a function of strain is invariant with respect to some of them, the isosurfaces appear to have the shape of a convex polyhedron for every strain having the following symmetric structure:

1. The and X points lie on the $\varepsilon_1=\varepsilon_2=\varepsilon_3$ line. Their coordinates are thus denoted by (a,a,a) and (b,b,b), respectively.
2. The $\alpha_j$ (j=1,2,3) points form a regular triangle which lies in a plane orthogonal to the $\varepsilon_1=\varepsilon_2=\varepsilon_3$ line. Their coordinates are denoted by (c,d,d)(d,c,d) and (d, d,c), respectively.
3. The $\beta_j$ (j=1,2,3) points also form a regular triangle which lies in a plane orthogonal to the $\varepsilon_1=\varepsilon_2=\varepsilon_3$ line. Their coordinates are denoted by (e,e,g), (g,e,e) and (e,g,e), respectively.

For a low bandgap values, X point lies outside the polyhedron itself and the corresponding vertex is rounded. We refer the farthest point of this rounding as $\chi^*$ (see FIG. 4). In the case of a higher strains, X point splits onto $\chi_1$, $\chi_2$ and $\chi_3$ points, which form a regular triangle. The topology of the isosurfaces is similar for both PBE and GW bandgaps, although the actual strain values differ for the same PBE and GW bandgap levels. It was found that the easiest shear-less way (with the least h($\varepsilon^{3D}$)) to obtain the 0 eV bandgap is to apply a biaxial deformation of −3.86% in one ⟨100⟩ direction and 4.36% along the other one. According to the PBE+GW model, the maximal bandgap reachable by silicon straining is 1.24 eV, which is realized by a triaxial 6.5% strain. It should be noted that silicon strained to such an extent almost reaches the Shockley-Queisser limit for solar cells, suggesting the application of elastic strain engineering to a silicon-based single PN junction may result in an efficiency improvement of the solar cell.

Figure 14A:
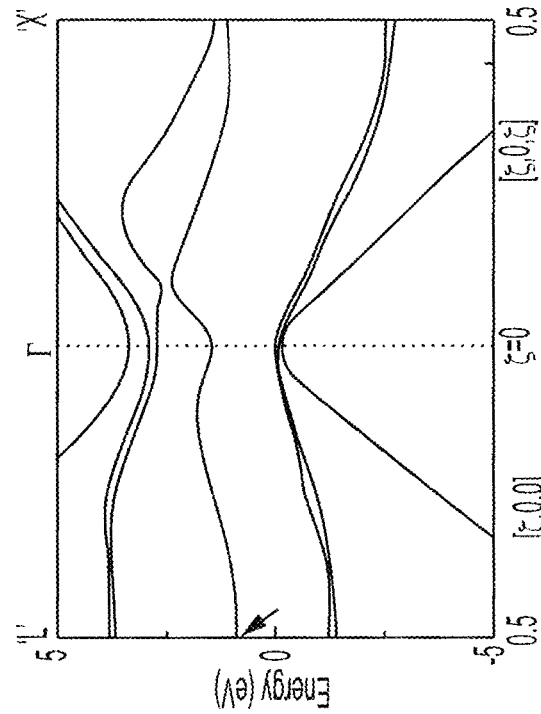
FIG. 14A is a graph of the band structure for silicon under a first strain as calculated with an energy dispersion model.
Figure 14B:
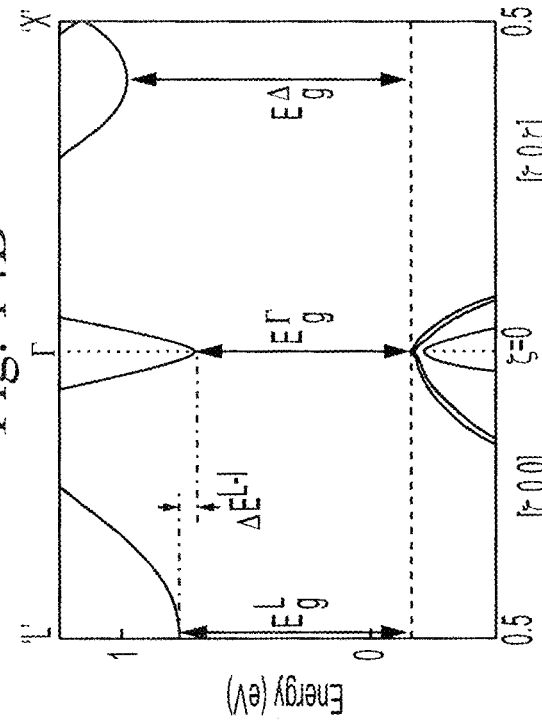
FIG. 14B is a graph of the band structure for silicon under a second strain as calculated with an energy dispersion model.
Figure 14C:
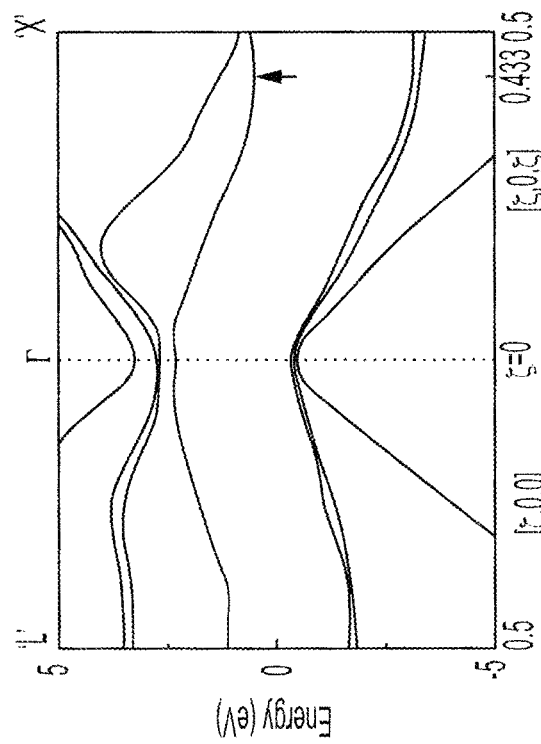
FIG. 14C is a graph of the band structure for silicon under a third strain as calculated with an energy dispersion model.
Figure 14D:
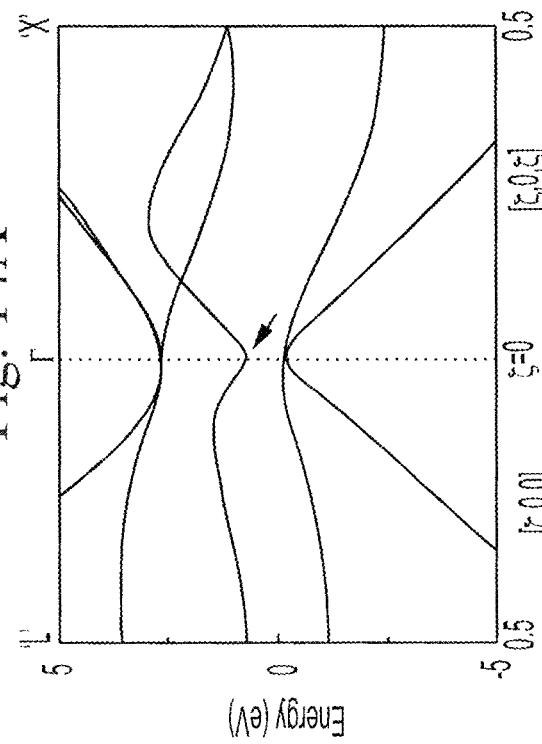
FIG. 14D is an enlarged band structure around the Fermi energy showing the competition of the three possible conduction band minima shown in FIGS. 14A-14C.

Bandgap depends on the relative position of the valence band maximum and the conduction band minimum, and different shapes of the two bands may result in the same bandgap value. Deep elastic strain engineering is concerned with hunting for important topological transition features on different faces of a bandgap isosurface. For undeformed silicon with a 1.1 eV bandgap, its valence band maximum (VBM) is located at the Γ-point and the conduction band minimum (CBM) lies on the straight line from Γ to X (the Δ-line) and is positioned at about 85% of the way to the Brillouin zone boundary. In the strain space, it was found that the VBM remained at Γ irrespective of deformation whereas the position of the CBM can be greatly affected by external strains. Four types of change in CBM may happen across the edges of the bandgap isosurface polyhedron, which were identified by the relative k-space position of the CBM as well as the geometry of the polyhedron. Specifically, FIGS. 14A-14C illustrate k-space transitions predicted by deep elastic strain engineering. The transitions were verified by DFT calculations with GW. FIGS. 14A-14B represent the 'Δ-L' transition and FIGS. 14B-14C show the indirect-to-direct transition. The CBM (arrows) are located at k-point (0.433, 0.433, 0), (0.5, 0, 0), and (0, 0, 0) respectively in FIGS. 14A-14C. FIG. 14D depicts the enlarged bandstructure around the Fermi energy which shows the competition of the three possible CBM positions. The three non-shear strain cases for 14A-14C are (−0.23%, 1.84%, 3.45%), (4.63%, 8.23%, 9.22%), and (9.85%, 9.31%, 9.4%), corresponding to points on the different faces of the bandgap isosurface in FIG. 13.

The 'Δ'-switching occurred when crossing the edges of $\mu-\alpha_j$, where the CBM lies along the 'Δ'-type line close to $(k_1,k_1, 0)$ $(0,k_1 k_1)$, or $(k_1,0,k_1)$, or, where $k_1 \approx 0.425$. In such situation, one can think of the applied strain to be small so that the CBM is still at the same position as for undeformed silicon and can adopt the linear deformation potential theory based on first-order perturbation theory to well describe the strain effects on the band extremum. However, in the large deformation case, due to the influence of changing band shape on the effective mass, the frozen CBM assumption does not hold anymore, and the occurrence of 'L-Δ' transitions was observed across the $\beta_i-\alpha_j$ edges on the polyhedron. In this case, the model was able to capture the change of CBM along 'Δ' to an 'L'-type point, see again FIGS. 14A-14D. Moving further towards the $\chi_2$ in the strain space. CBM would remain at L and a cross-over of the $\chi_2-\beta_j$ edge is referred to as an 'L'-switching. Near the upper tip of the bandgap isosurface the indirect-to-direct bandgap transition was observed where CBM appears at Γ, as shown in FIG. 14C. In general, as strain increases both $E_g^\Gamma$ and $E_g^L$ would decrease and the competition between the two scenarios is shown in FIG. 14D. As a result of high strains, decrease in $E_g^\Gamma$ is faster than $E_g^L$ and eventually the bandgap becomes direct when $E_g^\Gamma$ is smaller than $E_g^L$. Eliminating the involvement of phonons to facilitate adsorption or emission, the strained Si would have a significant enhancement in its optical transitions around the fundamental adsorption edge compared to an undeformed Si.

The above trained neural network models may also be implemented such that they may learn from and assimilate several training datasets. This capability is becoming increasingly desirable with the spread of materials property databases that collect data from different studies. To achieve that, a trained neural network model (NNM) was created using the previous set of parameters on the extended dataset with an increased regularization parameters such as dropout rate and weight regularization coefficient to avoid falling to the same local minima of the loss function. This allowed the model to not only handle additional training on the incoming data appended to a database but do it much faster than from scratch.

Numerical experiments conducted on the NNM demonstrated that incremental fitting of the models effectively reduced the error on a new dataset, see Table 3 below which lists the bandgap prediction errors both prior to and after the incremental fitting of the new data. Such incrementally fitted models are, thus, equally applicable to the bandgap approximation and various optimization tasks. Moreover, these models may be reused when shifting to other materials such as Ge or GaAs, since there are implicit insights about symmetries, transitions and extreme cases stored in the parameters of NNM. Training the model for the other material starting from the weights for Si may significantly reduce the time and amount of data needed due to knowledge transfer, also referred to as transfer learning, leading to a rapid development of versatile surrogate models for ESE.

TABLE 3

| | 3D | | 6D | |
|---|---|---|---|---|
| | Before | after | before | after |
| RMSE | 0.0403 | 0.0069 | 0.0264 | 0.0253 |
| MAE | 0.0167 | 0.0052 | 0.0179 | 0.0167 |

Based on the foregoing results for silicon, the disclosed statistical models provide an efficient way of representing electronic bandstructure allowing for studies and accurate elastic strain engineering predictions of a variety of physical phenomena such as band warping, degeneracy lifting, indirect-to-direct bandgap transition, semiconductor-to-semimetal transition, and so forth. Previously, bandgap engineering was conducted largely by tuning only one or two strain components. In contrast, the disclosed methods are capable of adapting to the problem at hand in a data-driven fashion, with highly nonlinear relations between electronic properties and the 6D strain tensor being explored more efficiently than conventional analytical methods. To this end, electronic bandstructure of silicon was learned from reference calculations. Employing deep neural network algorithms, the bandgap of Si was fit very accurately as a function of strain with a few milli-electronvolt accuracy. In contrast, performing visualization and optimization using plain DFT calculations takes a huge amount of time and solving new optimization problems must be repeated for every different strain coordinate from scratch every time. The fast and efficient bandstructure visualization in real time made possible by the disclosed methods are thus extremely beneficial for the rapid intentional engineering of elastically strained materials.

Example: Diamond

Figure 15:
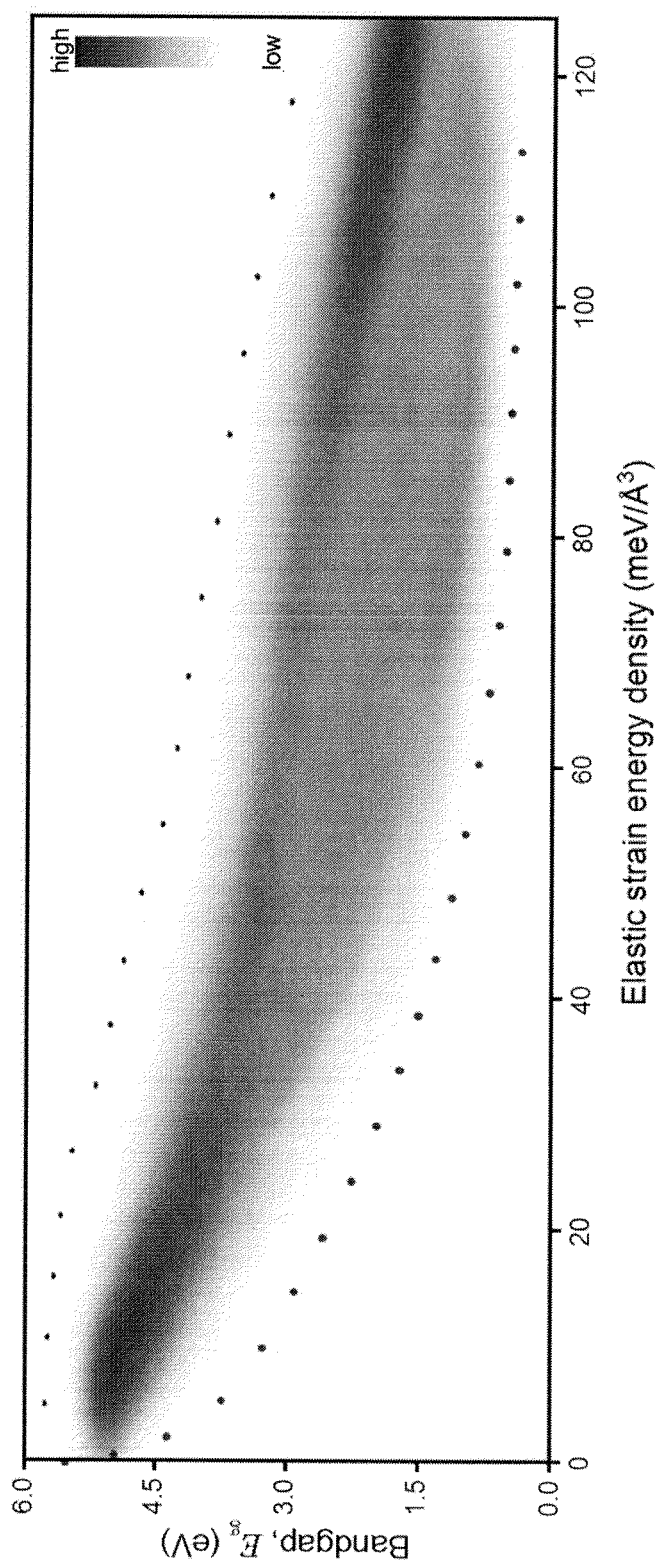
FIG. 15 is a graph of bandgap versus elastic strain energy density for diamond.

Recently, it has been shown that nanoscale diamond can reach 9% strain without fracture. Thus, the disclosed statistical models were used to study strain induced changes of the band structure and bandgap in diamond crystals under high strains from −5% to 10%. Accordingly, models for diamond were trained using the same methods described above for silicon. Using the trained neural network models, a bandgap envelope plot was developed which is shown in FIG. 15 as a plot of bandgap versus elastic strain energy density with the upper and lower edges of the bandgap envelope indicated by the dotted lines. Using the developed models, the largest bandgap of 5.87 eV was identified for a strain of $\varepsilon_{11}=\varepsilon_{22}=\varepsilon_{33}=-5\%$ strain (i.e. a triaxial compression) on the edge of the investigated area. The smallest bandgap of 5.87 eV was reached for the $\varepsilon_{11}=\varepsilon_{22}=-5\%$ and $\varepsilon_{33}=15\%$ strain, also on the edge of the investigated area. A 3D strain model predicted the strain energy density with a RMSE of 2 meV/Å$^3$ and the bandgap w a RMSE of 0.05 eV with the corresponding GW data used as a reference. This again confirms the accuracy, and general applicability, of the disclosed methods and models.

All definitions, as defined and used herein, should be understood to control over dictionary definitions, definitions in documents incorporated by reference, and/or ordinary meanings of the defined terms.

The indefinite articles "a" and "an," as used herein, unless clearly indicated to the contrary, should be understood to mean "at least one."

As used herein, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified.

The phrase "and/or," as used herein, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of."

The phraseology and terminology used herein is for the purpose of description and should not be regarded as limiting. The use of "including," "comprising," "having," "containing", "involving", and variations thereof, is meant to encompass the items listed thereafter and additional items.

While the present teachings have been described in conjunction with various embodiments and examples, it is not intended that the present teachings be limited to such embodiments or examples. On the contrary, the present teachings encompass various alternatives, modifications, and equivalents, as will be appreciated by those of skill in the art. Accordingly, the foregoing description and drawings are by way of example only.

What is claimed is:

1. A method comprising:
   obtaining a desired bandgap;
   providing the desired bandgap to a trained statistical bandgap model of a material and obtaining a corresponding output; and
   identifying, based on the output, a strain with a lowest strain energy density associated with the desired bandgap, wherein the strain has at least three degrees of freedom, wherein identifying the strain includes identifying the strain based at least partly on following a steepest descent strain direction, and wherein the strain with the lowest strain energy density is for use in an electrical circuit with the material to provide the desired bandgap energy,
   wherein the strain with the lowest strain energy density reduces the possibility of fracture and/or strain relaxation of the material.

2. At least one non-transitory computer-readable storage medium storing processor executable instructions that, when executed by at least one processor, cause the at least one processor to perform a method comprising:
   obtaining a desired bandgap;
   providing the desired bandgap to a trained statistical bandgap model of a material and obtaining a corresponding output; and
   identifying, based on the output, a strain with a lowest strain energy density associated with the desired bandgap, wherein the strain has at least three degrees of freedom, wherein identifying the strain includes identifying the strain based at least partly on following a steepest descent strain direction, and wherein the strain with the lowest strain energy density is for use in an electrical circuit with the material to provide the desired bandgap energy,
   wherein the strain with the lowest strain energy density reduces the possibility of fracture and/or strain relaxation of the material.

3. The method of claim 1, wherein the method further comprises outputting the identified strain to a user.

4. The method of claim 1, wherein the method further comprises generating a set of strain coordinates with the desired bandgap to form a bandgap isosurface.

5. The method of claim 4, wherein the method further comprises outputting the bandgap isosurface to a user.

6. The method of claim 1, wherein the model is a neural network model.

7. A method of determining a property of a component, the method comprising:
   obtaining, based at least in part on an operational parameter of the component during operation in an electrical circuit, a strain state of the component, wherein the strain state has at least three degrees of freedom;
   providing the strain state of the component to a trained statistical bandgap model of a material of the component and obtaining a corresponding output bandgap of the component;
   determining whether the output bandgap is a desired bandgap for use of the component in the electrical circuit; and
   forming the electrical circuit with the component subject to the strain state if the output bandgap is the desired bandgap.

8. The method of claim 7, wherein the method further comprises meshing a model of the component, and wherein obtaining the strain state of the component includes obtaining a strain state of a plurality of mesh elements of the meshed model, and wherein the output bandgap of the component includes bandgaps of the plurality of mesh elements.

9. The method of claim 8, wherein the method further comprises updating a bandgap parameter of the plurality of mesh elements with the bandgaps.

10. The method of claim 7, wherein the method further comprises outputting an indication of the bandgap of the component to a user.

11. The method of claim 7, wherein the component is part of an assembly, and wherein obtaining the strain state of the component includes determining a strain state of the assembly including the component using finite element analysis.

12. The method of claim 7, wherein the method further comprises storing the output bandgap of the component for subsequent use.

13. The at least one non-transitory computer readable storage medium of claim 2, wherein the method further comprises outputting the identified strain to a user.

14. The at least one non-transitory computer readable storage medium of claim 2, wherein the method further comprises generating a set of strain coordinates with the desired bandgap to form a bandgap isosurface.

15. The at least one non-transitory computer readable storage medium of claim 14, wherein the method further comprises outputting the bandgap isosurface to a user.

16. The at least one non-transitory computer readable storage medium of claim 2, wherein the model is a neural network model.

17. The method of claim 1, further comprising mechanically straining the material to the strain with the lowest strain energy density.

18. The method of claim 1, further comprising forming the electrical circuit comprising the material strained with the strain with the lowest strain energy density.

* * * * *